(12) United States Patent
Kunihiro et al.

(10) Patent No.: US 8,693,578 B2
(45) Date of Patent: Apr. 8, 2014

(54) TRANSMISSION DEVICE

(75) Inventors: Kazuaki Kunihiro, Tokyo (JP); Shinichi Hori, Tokyo (JP); Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/514,568

(22) PCT Filed: Dec. 1, 2010

(86) PCT No.: PCT/JP2010/071459
§ 371 (c)(1),
(2), (4) Date: Oct. 2, 2012

(87) PCT Pub. No.: WO2011/070952
PCT Pub. Date: Jun. 16, 2011

(65) Prior Publication Data
US 2013/0016795 A1 Jan. 17, 2013

(30) Foreign Application Priority Data
Dec. 8, 2009 (JP) .................. 2009-278399

(51) Int. Cl.
*H03C 1/52* (2006.01)

(52) U.S. Cl.
USPC ........ 375/300; 340/12.16; 370/205; 370/212; 375/238

(58) Field of Classification Search
None
See application file for complete search history.

(56) References Cited

U.S. PATENT DOCUMENTS

| | | | |
|---|---|---|---|
| 2003/0210096 A1 | 11/2003 | Pengelly et al. | |
| 2006/0091945 A1* | 5/2006 | Wegner | 330/10 |
| 2007/0254622 A1 | 11/2007 | Matsuura et al. | |
| 2009/0273396 A1* | 11/2009 | Nam et al. | 330/10 |
| 2009/0302938 A1* | 12/2009 | Andersen et al. | 330/10 |
| 2010/0033243 A1 | 2/2010 | Okazaki et al. | |
| 2010/0246713 A1* | 9/2010 | Vromans | 375/295 |

FOREIGN PATENT DOCUMENTS

| | | |
|---|---|---|
| JP | 2000-59153 A | 2/2000 |
| JP | 2002057732 A | 2/2002 |
| JP | 2002-135060 A | 5/2002 |
| JP | 2004048703 A | 2/2004 |
| JP | 2004128542 A | 4/2004 |

(Continued)

OTHER PUBLICATIONS

International Search Report for PCT/JP2010/071459 mailed Mar. 15, 2011.

(Continued)

*Primary Examiner* — Adolf Dsouza
(74) *Attorney, Agent, or Firm* — Sughrue Mion, PLLC

(57) ABSTRACT

A transmission device includes a pulse modulated signal generator that generates a pulse-modulated signal by changing the width of a pulse or the density of a pulse according to the magnitude of the amplitude component of an input signal while discretely changing the pulse height according to the magnitude of the amplitude, a modulated-signal generator that generates a modulated signal by integrating the pulse-modulated signal and the phase component of the input signal, a power amplifier that includes at least as many amplifiers as the number of the discrete amplitude levels of the modulated signal, changes the number of amplifies that amplify the modulated signal on the basis of the value of the amplitude level of the modulated signal, combines outputs of the amplifiers, and outputs a combined output, and an output filter that eliminates a square-wave component from the output of the power amplifier.

12 Claims, 18 Drawing Sheets

(56) References Cited

FOREIGN PATENT DOCUMENTS

| | | | |
|---|---|---|---|
| JP | 2004100358 | A1 | 11/2004 |
| JP | 2006203673 | A | 8/2006 |
| JP | 2007300400 | A | 11/2007 |
| JP | 2008104160 | A | 5/2008 |
| JP | 2008124540 | A | 5/2008 |
| JP | 2006238256 | A | 9/2009 |
| WO | 2008136080 | A1 | 11/2008 |

OTHER PUBLICATIONS

Written Opinion of the International Search Authority mailed Mar. 15, 2011.

International Preliminary Report on Patentability Chapter I mailed Mar. 15, 2011.

A digital $\varDelta\Sigma$RF signal generator for mobile communication transmitters in 90nm CMOS, 2008.

Office action in counterpart JP patent application 2011-545181, dated Feb. 4, 2014.

* cited by examiner

TRANSMISSION DEVICE

TECHNICAL FIELD

The present invention relates to a transmission device that includes a plurality of amplifiers.

BACKGROUND ART

Modulation schemes such as QPSK (Quadrature Phase Shift Keying) and multi-level QAM (Quadrature Amplitude Modulation) are being used in wireless communications such as mobile phones, wireless LANs (Local Area Networks) and digital television broadcasting.

These modulation schemes generate a modulated signal having a high PAPR (Peak-to-Average Power Ratio), which represents the ratio of peak power to average power. To amplify a modulated signal having a high PAPR by an amplifier, the amplifier needs to be operated in an operating region where the average output power is sufficiently lower than the saturation power of the amplifier in order to ensure high linearity of input and output characteristics of the amplifier. That is, a sufficiently large back-off from the saturation power of the amplifier needs to be ensured.

On the other hand, in the case of an amplifier that includes a field-effect transistor and the like, a large back-off decreases the average power efficiency of the amplifier because the smaller the output power, the lower is the power efficiency.

In next-generation mobile phones, wireless LANs, and digital television broadcasting, PAPR further increases because OFDM (Orthogonal Frequency Division Multiplexing) is used.

Thus the average power efficiency of an amplifier further decreases as the PAPR of a modulated signal increases. On the other hand, a Doherty-type amplifier has been devised which is an amplifier that achieves high power efficiency in an operating region with a large back-off.

FIG. 1 is a block diagram illustrating an exemplary configuration of Doherty-type amplifying device 820.

In Doherty-type amplifying device 820, an input end of amplifier 822 is connected to power divider 821 through signal line 812 and an output end of amplifier 822 is connected to ¼-wavelength transmission line 823. One end of transmission line 824 is connected to power divider 821 through signal line 813 and the other end is connected to amplifier 825. The other end of ¼-wavelength transmission line 823 is connected to amplifier 825 and resistive load 826.

Input terminal 811 accepts modulated signal 891. Power divider 821 divides power of modulated signal 891 from input terminal 811 into two. Power divider 821 divides modulated signal 891 and provides one of the resulting modulated signals to amplifier 822 through signal line 812 and provides the other onto transmission line 824 through signal line 813.

Amplifier 822 is a main amplifier biased to operate in class B. ¼-wavelength transmission lines 823 and 824 are ¼-wavelength impedance transformers having a characteristic impedance, $Z_0$. Amplifier 825 is a peak amplifier biased to operate in class C. Resistive load 826 has a load impedance, $Z_0/2$.

A basic operation of Doherty-type amplifying device 820 will be described below with reference to drawings.

FIG. 2 is a diagram showing the ideal power efficiency characteristic of Doherty-type amplifying device 820. FIG. 2 shows power efficiency characteristic 801 represented by a solid curve and probability density characteristic 809 represented by a dotted curve.

Power efficiency characteristic 801 represents the relationship between an amplitude normalized on the basis of the maximum amplitude of a modulated signal and the power efficiency of Doherty-type amplifying device 820. Probability density characteristic 809 is an amplitude distribution of a modulated signal in typical wireless communications and is a probability density characteristic based on a Rayleigh distribution having a peak at a back-off of 8 dB.

In power efficiency characteristic 801, when the normalized amplitude is less than or equal to "0.5", only amplifier 822 operates in Doherty-type amplifying device 820. In this case, amplifier 822 achieves its maximum power efficiency, 78.5%, at a normalized amplitude of "0.5". At this point, the load impedance when viewing resistive load 826 from the output end of amplifier 822 is "$2Z_0$" due to the impedance transformation characteristics of ¼-wavelength transmission line 823.

Therefore, the output power, $P_{1/2}$, of Doherty-type amplifying device 820 at a normalized amplitude of "0.5" can be expressed by the following equation.

$$P_{1/2} = V_{DD}^2/(4Z_0) = 0.5 \cdot Pmax$$

where $V_{DD}$ is the power supply voltage of amplifier 822 and Pmax is equal to $V_{DD}^2/(2Z_0)$.

When the normalized amplitude exceeds "0.5", amplifier 825 starts operating along with amplifier 822. In this case, current is provided from amplifier 825 to resistive load 826 and therefore the load impedance viewed from the output end of equivalent amplifier 825 increases from "$Z_0/2$" to "$Z_0$" because of the load-pull effect.

Accordingly, the load impedance when viewing resistive load 826 from the output end of amplifier 822 changes from "$2Z_0$" to "$Z_0$" due to the impedance transformation characteristics of ¼-wavelength transmission line 823.

Accordingly, when the normalized amplitude is "1.0", the output power of both amplifiers 822 and 825 reaches the maximum Pmax and maximum efficiency is achieved. Therefore, the output power of Doherty-type amplifying device 820 at a normalized amplitude of "1.0" is 2Pmax.

At this point, the power efficiency of entire Doherty-type amplifying device 820 is 78.5% because both amplifiers 822 and 825 operate at a saturation level. The average power efficiency weighted on the basis of probability density characteristic 809 is 64%.

Another amplifying device that achieves high power efficiency in a large back-off operating region is a class D amplifying device.

FIG. 3 is a diagram illustrating an exemplary configuration of a voltage-mode class D amplifying device. FIG. 3 illustrates class D amplifier 830 and output filter 840.

In class D amplifier 830, switching element 832 has a control terminal connected to the output end of inverter 831, one end connected to a power supply voltage $V_{DD}$, and another end connected to one end of switching element 833 and an input end of output filter 840. Switching element 833 has a control terminal connected to input terminal 814 and another end grounded.

Inverter 831 inverts a pulse signal which is a modulated signal. Switching elements 832 and 833 switch between connection and disconnection. Switching elements 832 and 833 may be implemented by field-effect transistors, for example.

Output filter 840 eliminates a square-wave component of a modulated signal amplified by class D amplifier 830. Output filter 840 is made up of inductor 841 and capacitance 841 that are connected in series.

In the configuration of the class D amplifying device, input pulse signal 893 input at input terminal 814 is provided to switching element 833 and input pulse signal 893 is inverted by inverter 831 and then provided to switching element 832. Accordingly, switching elements 832 and 833 operate in opposite phases.

Specifically, when switching element 832 is in a conduction (ON) state, current flows into output filter 840 from power supply voltage $V_{DD}$ through switching element 832. On the other hand, when switching element 833 is in an ON state, current flows from the ground to output filter 840.

In the operations of switching elements 832 and 833 described above, no voltage appears across switching element 832 when switching element 832 is in the conduction (ON) state and current is flowing through switching element 832. On the other hand, when switching element 832 is in a non-conduction (OFF) state and a voltage appears across switching element 832, no current flows through switching element 832 itself. The same applies to the operation of switching element 833.

Accordingly, no overlap product of current and voltage occurs in switching elements 832 and 833. Therefore, class D amplifier 830 can ideally amplify an input pulse signal with a power efficiency of 100%. Original signal 894 is reproduced by eliminating a square-wave component by output filter 840.

When the class D amplifying device illustrated in FIG. 3 is used, an input signal provided to input terminal 814 of the class D amplifying device needs to be converted to a binary (1-bit) pulse train signal having two levels, on and off. To convert the input signal to a pulse train signal, information concerning phase modulation and amplitude modulation needs to be superimposed on the input signal by using a pulse modulation technique.

FIG. 4 is a diagram illustrating an exemplary configuration of transmission device 850 using a class D amplifying device. Transmission device 850 includes signal modulator 860, class D amplifier 830, output filter 840, and antenna 856. Class D amplifier 830 and output filter 840 are similar to those illustrated in FIG. 3.

Signal modulator 860 includes signal generator 861, polar coordinate converter 862, delta-sigma modulator 863, frequency converter 864, integrator 865, and frequency oscillator 869.

Signal generator 861 converts an input signal to an I (in-phase) signal and a Q (quadrature) signal represented by an I component and a Q component that are orthogonal to each other on the basis of data to be transmitted. Polar coordinate converter 862 generates an amplitude component and a phase component of the input signal on the basis of the I component and the Q component generated by conversion by signal generator 861.

Delta-sigma modulator 863 converts the amplitude component from polar coordinate converter 862 to a pulse-modulated signal, which is a 1-bit (pulse) signal. Frequency converter 864 multiplies a phase signal from polar coordinate converter 862 by a carrier signal generated by frequency oscillator 869.

Integrator 865 multiplies a phase-modulated signal from frequency converter 864 by a pulse-modulated signal from delta-sigma modulator 863. By this multiplication, integrator 865 generates modulated signal 854, which is phase-modulated signal 853 controlled to turn on and off by pulse-modulated signal 852 output from delta-sigma modulator 863.

When class D amplifier 830 accepts modulated signal 854, class D amplifier 830 amplifies modulated signal 854 with an ideal efficiency of the class D amplifier of 100% while pulse-modulated signal 852 is turned on. Class D amplifier 830 does not consume power while pulse-modulated signal 852 is turned off. Accordingly, class D amplifier 830 ideally amplifies modulated signal 854 with an efficiency of 100%.

Output filter 840 eliminates a switching component of a modulated signal amplified by class D amplifier 830 and outputs output signal 855, which is an original signal amplified with high efficiency, through antenna 856.

Non-Patent Literature 1 describes a transmission device that applies delta-sigma modulation to both I component and Q component, which is another example of a transmission device using a class D amplifier. Here, an example of the transmission device described in Non-Patent Literature 1 will be briefly described with reference to a drawing.

FIG. 5 is a block diagram illustrating an exemplary configuration of transmission device 870 that applies delta-sigma modulation to I and Q components. Transmission device 870 includes signal modulator 880, class D amplifier 830, output filter 840, and antenna 856. Class D amplifier 830, output filter 840 and antenna 856 are similar to those illustrated in FIG. 3.

Signal modulator 880 includes delta-sigma modulators 881 and 884, integrators 882 and 886, clock signal generator 883, delayer 885, and modulated signal generator 887.

An I signal and a Q signal that are orthogonal to each other are provided to input terminals 816 and 817, respectively. Delta-sigma modulators 881 and 884 apply delta-sigma modulation to signals from input terminals 816 and 817, respectively, to generate pulse signal trains 871 and 872, respectively, which are 1-bit signals.

Clock signal generator 883 generates a clock signal having a frequency four times the frequency of a carrier. Clock signal generator 883 generates a ternary clock signal that has amplitude levels "1", "0", "−1", "0" that are repeated in this order. That is, clock signal generator 883 generates a clock signal that repeatedly assumes different values, a (where a is a positive number) 0, −a, 0, in this order. Clock signal generator 883 provides the generated clock signal to integrator 882 and delayer 885.

Delayer 885 delays the clock signal provided from clock signal generator 883 by one clock period.

Integrator 882 integrates pulse signal train 871 which is the 1-bit signal output from delta-sigma modulator 884 with the clock signal from clock signal generator 883.

Integrator 886 integrates pulse signal train 872 which is the 1-bit signal output from delta-sigma modulator 884 by the clock signal from delayer 885 that has been delayed by one clock period. This maintains the orthogonal relation between the I signal and the Q signal.

Modulated signal generator 887 adds signals from integrators 882 and 886 together. Thus, signal modulator 880 can generate pulse signal train 873 in which I and Q signals are superimposed on the clock signal in the order "I", "Q", "−I", "−Q", as a modulated signal.

In this way, transmission devices 850 and 870 can amplify a modulated signal in class D amplifier 830 with high power efficiency by generating a pulse signal train by using the delta-sigma modulator.

Another example of a transmission device that performs delta-sigma modulation is a transmission device that changes the height of a pulse of a pulse-modulated signal described in Patent Literature 1. The transmission device reduces generated quantization noise by performing the delta-sigma modulation.

The transmission device described in Patent Literature 1 includes an amplitude calculator, a divider, a delta-sigma modulator, a variable-gain amplifier, and an amplitude amplifier.

The amplitude calculator outputs a plurality of discrete-value signals according to the magnitude of an amplitude signal which is an amplitude component of an input signal. The divider divides the amplitude signal by the discrete-value signal and outputs the resulting amplitude signal. Delta-sigma modulator applies delta-sigma modulation to the amplitude signal.

Variable-gain amplifier amplifies an output signal from the delta-sigma modulator with a gain corresponding to the discrete-value signal. The amplitude amplifier provides the amplitude modulator with a voltage corresponding to the magnitude of the amplified output signal. The amplitude amplifier is a class D amplifier made up of a switching regulator and a switch regulator, for example.

Thus, the transmission device described in Patent Literature 1 can reduce quantization noise because the delta-sigma modulator operates near a saturation level, even when the amplitude signal is small.

CITATION LIST

Patent Literature

Patent Literature 1: JP2008-104160A

Non-Patent Literature

Non-Patent Literature 1: Antoine Frappe, Bruno Stefanelli, Axel Flament, Andreas Kaiser and Andreia Cathelin, Proceedings of the 2008 IEEE Radio Frequency Integrated Circuits Symposium, pp. 13-16

SUMMARY OF INVENTION

Technical Problems

Transmission devices 850 and 870 have a problem that the signal to noise ratio (SN ratio) is degraded by quantization noise due to the delta-sigma modulation.

Another problem with transmission devices 850 and 870 is that a fixed power loss is caused by factors such as on/off switching of class D amplifier 830 (hereinafter referred to as "switching loss"). Accordingly, the ratio of switching loss to output power of class D amplifier 830 increases as the amplitude of the input signal decreases. Therefore, the power efficiency decreases when an input signal having a small amplitude is amplified.

The transmission device described in Patent Literature 1 can reduce quantization noise caused by delta-sigma modulation but has a problem that the power efficiency is low in a range where the input signal is small as described above because the amplitude amplifier is implemented by a class D amplifier.

An object of the present invention is to provide a transmission device that solves the problems described above.

Solution to Problems

A transmission device of the present invention is a transmission device for amplifying and transmitting an input signal including an amplitude component and a phase component. The transmission device includes: pulse-modulated signal generating means that generates a pulse-modulated signal by changing the width of a pulse or the density of a pulse according to the magnitude of the amplitude component of the input signal while discretely changing the height of the pulse according to the magnitude of the amplitude component of the input signal; modulated signal generating means that integrates the pulse-modulated signal and the phase component of the input signal to generate a modulated signal having an amplitude level that discretely changes according to the height of a pulse of the pulse-modulated signal; power amplifying means that includes at least as many amplifying means as the number of discrete amplitude levels of the modulated signal, combines outputs of the operating amplifying means and outputs a combined output, wherein the number of the operating amplifying means that amplify the modulated signal from among the amplifying means increases as the amplitude level of the modulated signal increases; and filtering means that eliminates a square-wave component from the output of the power amplifying means.

A transmission device of the present invention is a transmission device for amplifying and transmitting an input signal that includes an I component and a Q component that are orthogonal to each other and has an amplitude component defined by the I component and the Q component. The transmission device includes: pulse-modulated signal generating means that generates a pulse-modulated signal of the I component by changing the width of a pulse or the density of a pulse according to the magnitude of the I component while discretely changing the height of the pulse according to the magnitude of the amplitude component of the input signal, and that generates a pulse-modulated signal of the Q component by changing the width of a pulse or the density of a pulse according to the magnitude of the Q component while discretely changing the height of the pulse according to the magnitude of the amplitude component of the input signal; clock signal generating means that generates a clock signal having an amplitude level that repeatedly assumes a, 0, −a, and 0, in this order, where a is a positive number; integrated signal generating means that generates a first integrated signal by integrating the clock signal and the pulse-modulated signal of the I component and generates a second integrated signal by integrating a signal that is the clock signal delayed by 1 clock period and the pulse-modulated signal of the Q component; modulated signal generating means that generates a modulated signal having an amplitude level that discretely changes according to the pulse height of the pulse modulated signals of the I and Q components by adding the first integrated signal and the second integrated signal together; and power amplifying means that receives the modulated signal as an input, includes at least as many amplifying means as the number of the discrete amplitude levels of the modulated signal, combines outputs of operating amplifying means, and outputs a combined output, wherein the number of the operating amplifying means that amplify the modulated signal from among the amplifying means increases as the amplitude level of the modulated signal increases.

Advantageous Effects of Invention

The present invention enables generation of an output signal that has high power efficiency even in an operating region with a large back-off of input power and has small waveform distortion.

DESCRIPTION OF EMBODIMENTS

A first exemplary embodiment will be described with reference to drawings.

Figure 6:
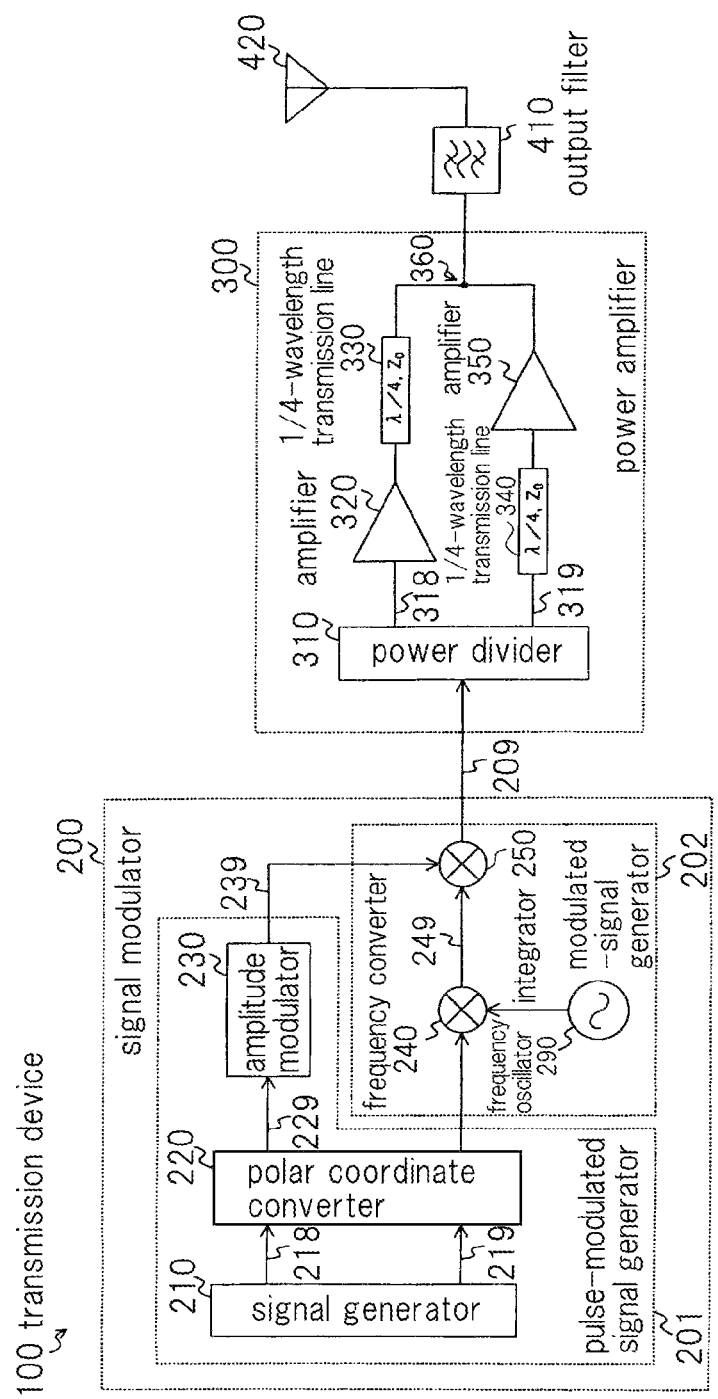
FIG. 6 is a block diagram illustrating an exemplary configuration of a transmission device according to a first exemplary embodiment.

FIG. 6 is a block diagram illustrating an exemplary configuration of a transmission device according to the first exemplary embodiment. Transmission device 100 amplifies an input signal including an amplitude component and a phase component and transmits the amplified signal. Transmission device 100 includes signal modulator 200, power amplifier 300, output filter 410, and antenna 420.

Signal modulator 200 integrates a pulse-modulated signal that represents the magnitude of an amplitude component of an input signal as the width of a pulse or the density of a pulse and the heights of a plurality of discrete pulses with a phase component of the input signal to generate a modulated signal. Signal modulator 200 includes pulse-modulated signal generator 201 and modulated-signal generator 202.

Pulse-modulated signal generator 201 includes signal generator 210, polar coordinate converter 220, and amplitude modulator 230. Modulated signal generator 202 includes frequency converter 240, integrator 250, and frequency oscillator 290.

Pulse-modulated signal generator 201 is pulse-modulated signal generating means that generates a pulse-modulated signal by changing the width or density of a pulse according to the magnitude of the amplitude component of the input signal while discretely changing the height of a pulse according to the magnitude of the amplitude component of the input signal.

The pulse-modulated signal is a pulse signal whose pulse width or pulse density varies and whose pulse height has an amplitude level representing zero (a predetermined value) and N amplitude levels (where N is an integer greater than or equal to 2) that represent values greater than zero (hereinafter the levels are referred to as "saturation levels").

Signal generator 210 generates an input signal based on data to be transmitted. The input signal is a digital baseband signal represented by an I (in-phase) component and a Q (quadrature) component that are orthogonal to each other. Signal generator 210 provides the I component and Q component of the generated input signal to polar coordinate converter 220 through signal lines 218 and 219, respectively.

Polar coordinate converter 220 calculates an amplitude component and a phase component of the input signal on the basis of the I component and the Q component from signal generator 210. Polar coordinate converter 220 calculates the amplitude component r and the phase component θ according to the following equation, for example.

$$r=(I^2+Q^2)^{0.5}$$

$$\theta=\tan^{-1}(Q/I)$$
Equation 1

Polar coordinate converter 220 provides the calculated amplitude component to amplitude modulator 230 thorough signal line 229 as an amplitude signal. At the same time, the polar coordinate converter 220 provides the calculated phase component to frequency converter 240 as a phase signal.

Amplitude modulator 230 generates a pulse-modulated signal by changing the amplitude signal to a pulse-modulated signal. Amplitude modulator 230 changes the width or density of a pulse according to the magnitude of the amplitude signal while discretely changing the height of the pulse according to the magnitude of the amplitude signal.

Amplitude modulator 230 uses a pulse height corresponding to the magnitude of the amplitude signal from polar coordinate converter 220 out of the predetermined N pulse heights (excluding zero) to modulate the width or density of the a pulse according to the magnitude of the amplitude signal.

For example, amplitude modulator 230 applies delta-sigma modulation (pulse density modulation) or pulse width modulation to an amplitude signal by using a saturation level that is determined on the basis of a predetermined N−1 amplitude threshold value and the magnitude of the amplitude signal from the polar coordinate converter 220.

According to the first exemplary embodiment, amplitude modulator 230 generates a pulse-modulated signal that has amplitude levels (pulse heights), "0.0", "0.5", and "1.0" on the basis of the magnitude of the amplitude signal, where "1.0" is a normalized maximum height of a pulse output from amplitude modulator 230.

For example, amplitude modulator 230 normalizes the amplitude signal on the basis of a maximum amplitude signal value of 1.0, and compares the magnitude of the normalized amplitude (hereinafter referred to as the "normalized amplitude") with an amplitude threshold value that has been set to 0.5. When magnitude of the normalized amplitude is less than or equal to 0.5, amplitude modulator 230 sets the amplitude level of amplitude modulator 230 to 0.5; when the magnitude of the normalized amplitude exceeds 0.5, amplitude modulator 230 sets the saturation level of amplitude modulator 230 to 1.0.

In this way, amplitude modulator 230 generates a pulse modulated signal having two saturation levels, 0.5 and 1.0.

Amplitude modulator 230 provides the generated pulse-modulated signal to integrator 250 through signal line 239. FIG. 7 illustrates an example of the pulse-modulated signal generated by amplitude modulator 230 on the basis of an amplitude signal.

Figure 7A:
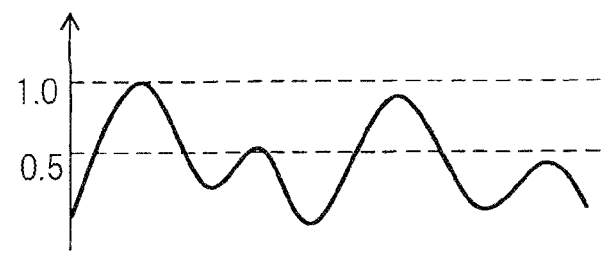
FIG. 7a is a diagram illustrating an example of an amplitude signal provided to amplitude modulator 230.
Figure 7B:
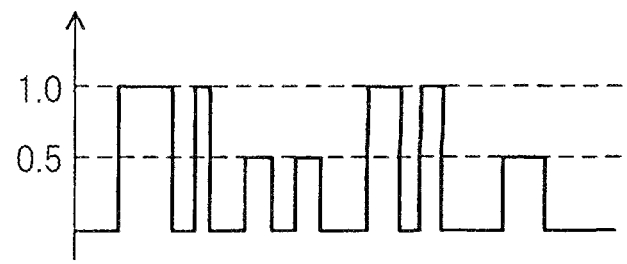
FIG. 7b is a diagram illustrating a pulse-modulated signal generated on the basis of an amplitude signal.

FIG. 7a is a diagram illustrating an example of an amplitude signal provided onto signal line 229. FIG. 7b is a diagram illustrating an example of a pulse-modulated signal generated on the basis of the amplitude signal illustrated in FIG. 7a. In FIGS. 7a and 7b, the horizontal axis represents time and the vertical axis represents the magnitude of amplitude.

Modulated signal generator 202 is modulated signal generating means that generates a modulated signal on the basis of a pulse-modulated signal provided from pulse-modulated signal generator 201 and a phase component provided from polar coordinate converter 220. Modulated signal generator 202 integrates the pulse-modulated signal and the phase component to generate a modulated signal whose amplitude level discretely changes according to the height of the pulse of the pulse-modulated signal.

Frequency converter 240 is a multiplier that multiplies a carrier signal generated by frequency oscillator 290 by a phase signal from polar coordinate converter 220. Frequency converter 240 thus generates a phase-modulated signal in which the frequency of the carrier signal is added to the frequency component of the phase signal (upconversion). Frequency converter 240 provides the generated phase-modulated signal to integrator 250 through signal line 249.

Integrator 250 integrates the phase-modulated signal from frequency converter 240 and the pulse modulated signal from amplitude modulator 230. Integrator 250 thus generates a modulated signal whose amplitude level discretely changes according to the height of a pulse of the pulse-modulated signal.

The modulated signal is a burst signal resulting from turning on and off the phase-modulated signal by a pulse-modulated signal with two saturation levels (pulse heights) and has two discrete amplitude levels.

Integrator 250 provides the generated modulated signal to power amplifier 300 through signal line 209. FIG. 7 illustrates an example of the modulated signal generated by integrator 250 on the basis of a pulse-modulated signal and a phase-modulated signal.

Figure 7C:
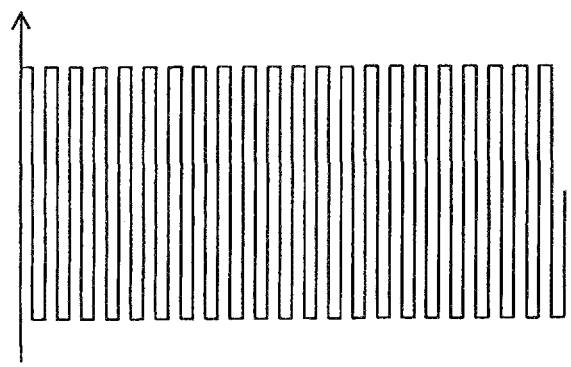
FIG. 7c is a diagram illustrating an example of a phase-modulated signal output from frequency converter 240.
Figure 7D:
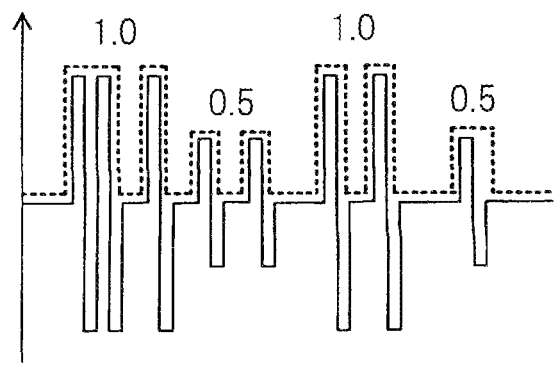
FIG. 7d is a diagram illustrating a modulated signal generated on the basis of a modulated signal and a phase-modulated signal.

FIG. 7c is a diagram illustrating an example of a phase-modulated signal provided through signal line 249. FIG. 7d is a diagram illustrating an example of a modulated signal generated by integrator 250 on the basis of the pulse-modulated signal and the phase-modulated signal illustrated in FIGS. 7b and 7c, respectively. In FIG. 7d, the modulated signal is represented by a solid line and an envelope of the modulated signal is represented by dotted curves. In FIGS. 7c and 7c, the horizontal axis represents time and the vertical axis represents the magnitude of amplitude.

Power amplifier 300 is power amplifying means that amplifies a modulated signal generated by modulated signal generator 202. Power amplifier 300 has as many amplifiers (amplifiers 320 and 350) as the number of the discrete amplitude levels of the modulated signal, that is, the saturation levels of the pulse-modulated signal.

The number of amplifiers in power amplifier 300 that amplify a modulated signal (hereinafter referred to as the "operating amplifiers) out of amplifiers 320 and 350 increases as the amplitude level of the modulated signal increases. Power amplifier 300 combines the outputs of the operating amplifiers and outputs the combined output. The operating amplifiers can be generally called operating amplifying means.

In the first exemplary embodiment, when power amplifier 300 accepts a pulse modulated signal of an amplitude level corresponding to the pulse height "0.5" of a pulse-modulated signal, one operating amplifier (amplifier 320) operates.

When power amplifier 300 accepts a pulse-modulated signal of an amplitude level corresponding to the pulse height "1.0" of a pulse-modulated signal, two operating amplifiers (amplifiers 320 and 350) operate and power amplifier 300 combines the outputs from these operating amplifiers and outputs the combined output.

When power amplifier 300 accepts a pulse-modulated-signal of an amplitude level corresponding to the pulse height "0.0" of a pulse-modulated signal, amplifiers 320 and 350 do not operate. Accordingly, power amplifier 300 does not consume power during a period in which the modulated-signal is turned off.

Power amplifier 300 includes power divider 310 and ¼-wavelength transmission lines 330 and 340, in addition to amplifiers 320 and 350.

In power amplifier 300, amplifier 320 has an input terminal connected to power divider 310 through signal line 318 and an output end connected to ¼-wavelength transmission line 330. ¼-wavelength transmission line 340 has one end connected to power divider 310 though signal line 319 and the other end connected to amplifier 350. The other end of ¼-wavelength transmission line 330 is connected to amplifier 350 and combiner 360.

Power amplifier 300 is a Doherty-type amplifier in which amplifier 320 and ¼-wavelength transmission line 330 are connected in parallel with ¼-wavelength transmission line 340 and amplifier 350.

Power divider 310 divides power of a modulated signal from signal line 209 into two. Power divider 310 provides one of the resulting modulated signals to amplifier 320 through signal line 318 and the other to ¼-wavelength transmission line 340 through signal line 319.

Figure 3:
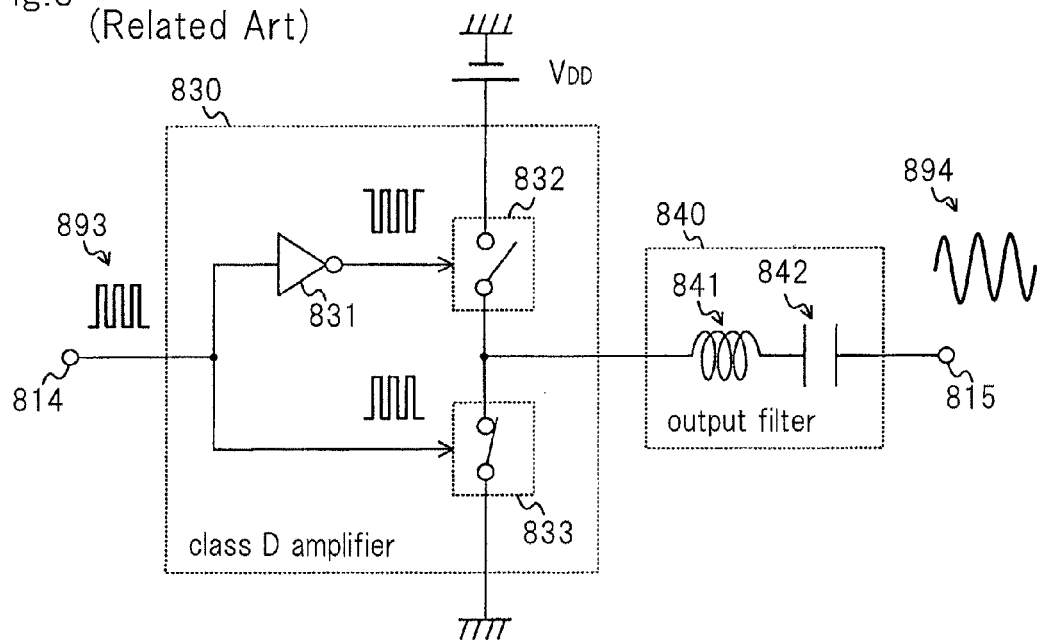
FIG. 3 is a block diagram illustrating an exemplary configuration of a class D amplifier.

Amplifier 320 is a main amplifier (or a carrier amplifier) biased to operate in class B. Like class D amplifier 830 illustrated in FIG. 3, amplifier 320 includes elements such as transistors which are switching elements.

Furthermore, amplifier 320 is biased to operate when a modulated signal while the pulse height of the pulse-modulated signal is greater than or equal to "0.5" is provided through signal line 209. Amplifier 320 is configured to provide its maximum power efficiency when a modulated signal while the pulse height of the pulse-modulated signal is greater than or equal to "0.5" is accepted.

Accordingly, amplifier 320 amplifies a modulated signal the maximum power efficiency when the pulse height of the pulse-modulated signal is "0.5" or "1.0".

Amplifier 320 operates on a modulated signal when the pulse height of the pulse-modulated signal is "0.5" or "1.0" (on-period) but does not operate on a modulated signal when the pulse height of the pulse modulated signal is "0.0" (off-period).

Amplifier 320 may be a switching-mode amplifier (for example a class D amplifier), for example.

Amplifier 320 outputs the amplified modulated signal to output filter 410 through ¼-wavelength transmission line 330. Amplifier 320 can be generally called amplifying means or operating amplifying means.

¼-wavelength transmission line 330 is a ¼-wavelength impedance transformer having a characteristic impedance $Z_0$. ¼-wavelength transmission line 330 outputs a modulated signal from amplifier 320 to output filter 410 through combiner 360.

¼-wavelength transmission line 340 is a ¼-wavelength impedance transformer having a characteristic impedance $Z_0$. ¼-wavelength transmission line 340 outputs a modulated signal from signal line 319 to amplifier 350.

Amplifier 350 is a peak amplifier biased to operate in class C. Amplifier 350 includes elements such as transistors which are switching elements, for example.

Furthermore, amplifier 350 is biased to operate when a modulated signal while the pulse height of the pulse-modulated signal is "1.0" is provided through signal line 209. Amplifier 350 is configured to provide maximum power efficiency when a modulated signal in which the pulse height of the pulse-modulated signal is "1.0" is accepted.

Accordingly, amplifier 350 amplifies at maximum power efficiency only when a modulated signal while the pulse height of the pulse-modulated signal is "1.0" is accepted from ¼-wavelength transmission line 340.

Amplifier 350 operates on a modulated signal when the pulse height of the pulse-modulated signal is "1.0" but does not operate on a modulated signal when the pulse height of the pulse-modulated signal is "0.0" or "0.5".

Amplifier 350 may be a switching-mode amplifier, for example.

Amplifier 350 outputs the amplified modulated signal to output filter 410 through combiner 360. Amplifier 350 can be generally called amplifying means or operating amplifying means.

Combiner 360 combines a modulated signal from ¼-wavelength transmission line 330 with a modulated signal from amplifier 350.

Output filter 410 eliminates a square-wave component from the output of power amplifier 300 to output a modulated signal approximating the waveform of an input signal to antenna 420 as an output signal. Output filter 410 can be generally called filter means.

Figure 7E:
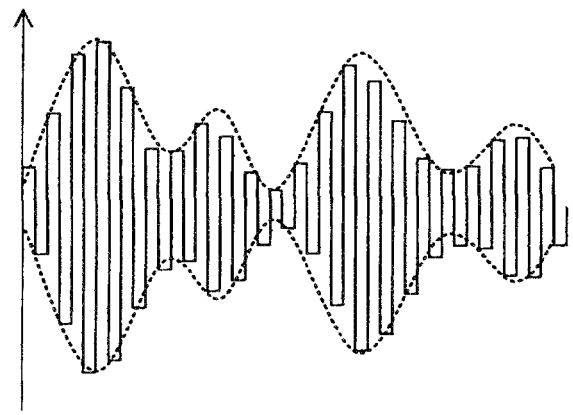
FIG. 7e is a diagram illustrating a modulated signal from which a square-wave component has been eliminated by output filter 410.

FIG. 7e is a diagram illustrating an example of a modulated signal generated by amplifying the modulated signal illustrated in FIG. 7d by power amplifier 300 and then eliminating the square-wave component by output filter 410. Here, the modulated signal is represented by a solid line and the envelope of the modulated signal that corresponds to the waveform of the pulse-modulated signal is represented by dotted curves.

It can be seen that the waveform of the modulated signal illustrated in FIG. 7e approximates the waveform of the envelope of the amplitude signal represented by the dotted curves in FIG. 7e. In FIG. 7e, the horizontal axis represents time and the vertical axis represents the magnitude of amplitude.

Antenna 420 converts an electrical signal, which is a modulated signal from output filter 410, to a radio wave (electromagnetic wave).

Figure 8:
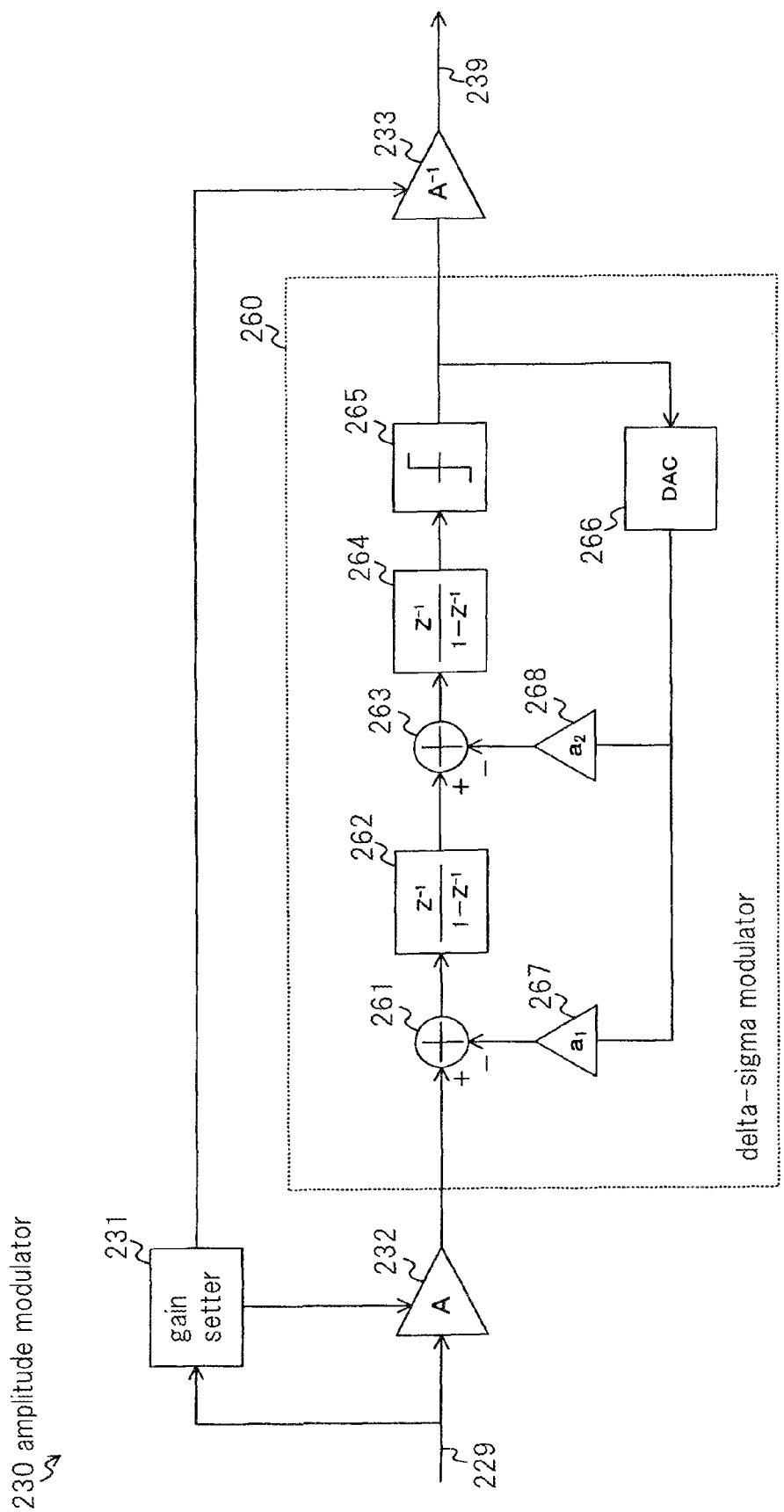
FIG. 8 is a block diagram illustrating an exemplary configuration of amplitude modulator 230.

FIG. 8 is a block diagram illustrating an exemplary configuration of amplitude modulator 230.

Amplitude modulator 230 includes gain setter 231, gain multipliers 232 and 233, and delta-sigma modulator 260. Delta-sigma modulator 260 includes adders 261 and 263, integrators 262 and 264, quantizer 265, digital-analog converter (DAC) 266, and multipliers 267 and 268.

The example will be described in which the height of a pulse output from delta-sigma modulator 260, that is, a saturation level of delta-sigma modulator 260, is normalized to "1.0".

Gain setter 231 sets any of predetermined N gain coefficients in gain multipliers 232 and 233 on the basis of the magnitude of an amplitude signal from signal line 229. Gain setter 231 selects a gain coefficient A from among the N gain coefficients on the basis of predetermined N−1 amplitude thresholds. Gain setter 231 sets the selected gain coefficient A in gain multiplier 232 and sets the reciprocal $A^{-1}$ of the gain coefficient in gain multiplier 233.

For example, gain setter 231 normalizes the amplitude signal on the basis of a maximum value of the amplitude signal, "1.0", and compares the magnitude of the normalized amplitude (hereinafter referred to as the "normalized amplitude") with an amplitude threshold that has been set to "0.5". When the magnitude of the normalized amplitude is smaller than or equal to "0.5", gain setter 231 selects a gain coefficient A of "2.0".

In this case, gain setter 231 sets the selected gain coefficient, "2.0", in gain multiplier 232 and also sets the reciprocal $A^{-1}$, "0.5", of the gain coefficient in gain multiplier 233. That is, inside amplitude modulator 230, gain setter 231 extends an amplitude signal of the maximum "0.5" to be provided to delta-sigma modulator 260 to "1.0" and processes the signal, then sets a saturation level of "0.5" in gain multiplier 233.

On the other hand, when the magnitude of the normalized amplitude exceeds "0.5", gain setter 231 selects a gain coefficient of "1.0". In this case, gain setter 231 sets the selected gain coefficient A, "1.0", in gain multiplier 232 and sets the reciprocal $A^{-1}$, "1.0", of the gain coefficient in gain multiplier 233.

Gain multiplier 232 multiplies the gain coefficient A set by gain setter 231 by the amplitude signal from signal line 220 to change the magnitude of the amplitude signal.

Gain multiplier 232 is first variable-gain amplifying means whose gain discretely increases as the amplitude component of an input signal decreases and amplifies the amplitude component of the input signal by the gain.

For example, when a gain coefficient A of 2.0 is set, gain multiplier 232 doubles the magnitude of the amplitude signal. Gain multiplier 232 provides the multiplied amplitude signal to adder 261.

Gain multiplier 233 multiplies the reciprocal $A^{-1}$ of the gain coefficient set by gain setter 231 by a signal from quantizer 265 to set the level of the signal from quantizer 265 to a level corresponding to the amplitude signal from signal line 229.

Amplitude multiplier 233 is second variable-gain amplifying means that amplifies a 1-bit signal output from delta-sigma modulator 260 by a gain equivalent to the reciprocal of a gain set in gain multiplier 232 to generate a pulse-modulated signal.

When 0.5, for example, is set as the reciprocal $A^{-1}$ of the gain coefficient, gain multiplier 233 changes the magnitude of the signal from quantizer 265 by a factor of 0.5. Gain multiplier 233 outputs the multiplied signal to signal line 239 as a pulse-modulated signal.

Delta-sigma modulator 260 is modulating means that applies delta-sigma modulation to output from gain multiplier 232 to generate a 1-bit binary signal. Delta-sigma modulator 260 may be a second-order delta-sigma modulator, for example, that applies pulse modulation to a signal from gain multiplier 232.

Adder 261 subtracts a feedback signal provided from multiplier 267 from a signal output from gain multiplier 232. Adder 261 outputs the resulting signal to integrator 262.

Integrator 262 performs integration of signals output from adder 261. Integrator 262 outputs the integrated signal to adder 623.

Adder 263 subtracts a feedback signal output from multiplier 268 from a signal output from integrator 262. Adder 263 outputs the resulting signal to integrator 264.

Integrator 264 performs integration of signals output from adder 263. Integrator 264 outputs the integrated signal to quantizer 265.

Quantizer 265 generates a 1-bit (binary) signal on the basis of the magnitude of a signal output from integrator 264. Quantizer 265 generates a quantized signal representing "1" or "0". Quantizer 265 outputs the generated quantized signal to gain multiplier 233 and also to digital-analog converter 266 as a feedback signal.

Digital-analog converter (DAC) 266 converts a 1-bit signal, which is a feedback signal from quantizer 265, to a numerical value corresponding to an amplitude signal, which is an analog signal. Digital-analog converter 266 outputs the converted feedback signal to multipliers 267 and 268.

Multiplier 267 multiplies the feedback signal from digital-analog converter 266 by a predetermined weighting factor $a_1$. Multiplier 267 outputs the multiplied feedback signal to adder 261.

Multiplier 268 multiplies the feedback signal from digital-analog converter 266 by a predetermined weighting factor $a_2$. Multiplier 268 outputs the multiplied feedback signal to adder 263.

In this way, gain setter 231 sets a gain coefficient according to the magnitude of the amplitude signal to cause the level of the signal from gain multiplier 232 to approach the saturation level of delta-sigma modulator 260. Consequently, amplitude modulator 230 can reduce quantization noise caused by delta-sigma modulation.

The pulse modulation method of amplitude modulator 230 is not limited to the configuration illustrated in FIG. 8. Furthermore, the order and parameters of delta-sigma modulator 260 may be changed as required according to a system to which this exemplary embodiment is applied. Moreover, a pulse-width modulator may be used in place of delta-sigma modulator 260.

While the first exemplary embodiment has been described with an example in which the amplitude threshold value is set to "0.5", the amplitude threshold value may be set to other value. In that case, an adjustment may be made to gain coefficient A of gain setter 231 or the circuit size of amplifiers 320 and 350.

FIG. 9 shows diagrams concerning results of simulations of pulse-modulated signals generated by amplitude modulator 230.

Figure 9A:
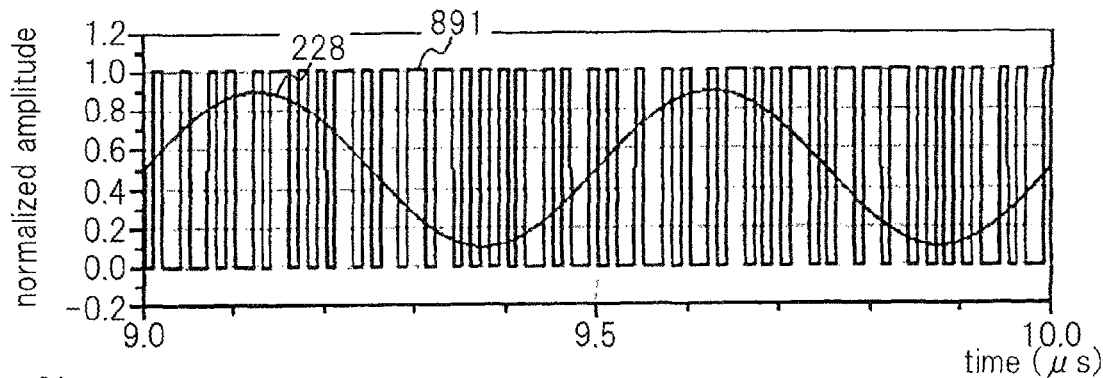
FIG. 9a is a diagram illustrating a waveform of a typical binary (0, 1) pulse-modulated signal.
Figure 9B:
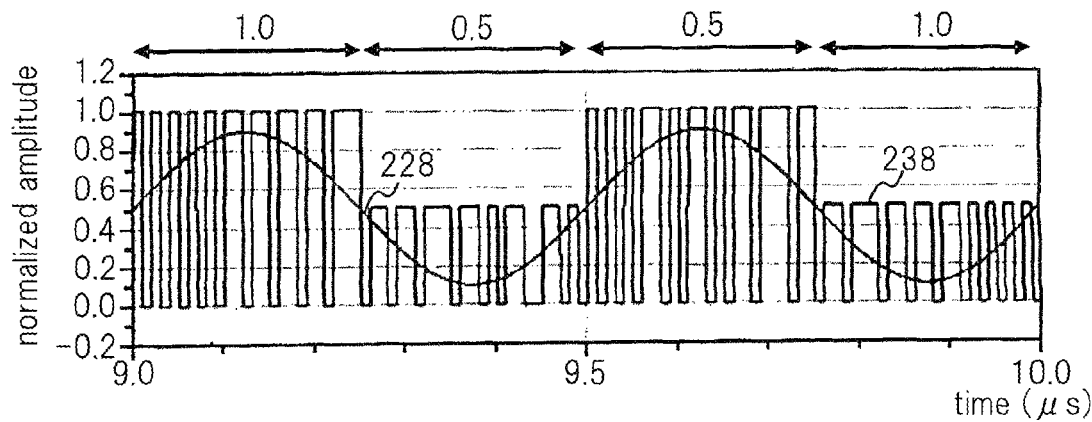
FIG. 9b is a diagram illustrating a waveform of a ternary pulse-modulated signal generated by amplitude modulator 230.

FIG. 9a is a diagram illustrating the waveform of a typical binary (0, 1) pulse-modulated signal. FIG. 9b is a diagram illustrating the waveform of a ternary pulse-modulated signal generated by amplitude modulator 230. In FIG. 9, the amplitude signal is a sinusoidal signal of 2 MHz and the frequency of the sampling clock signal for amplitude modulator 230 is 200 MHz.

As shown in FIG. 9b, the saturation level of pulse-modulated signal 238 is "1.0" when the normalized amplitude of amplitude signal 228 is in the range which is greater than 0.5 and which is less than or equal to 1.0.

When the normalized amplitude of amplitude signal 228 is less than or equal to "0.5", the saturation level of pulse-modulated signal 238 is "0.5". It can be seen that during this period, pulse-modulated signal 238 has an average duty ratio greater than pulse modulated signal 891 illustrated in FIG. 9a in the "0.5" amplitude level range.

Accordingly pulse-modulated signal 238 has a greater duty ratio than that in FIG. 9a. Thus, delta-sigma modulator 260 operates near the saturation level in the period in which the saturation level of pulse-modulator 238 is 0.5 and therefore a high SN ratio can be achieved.

The operation of power amplifier 300 will be described next with reference to drawings.

Figure 10A:
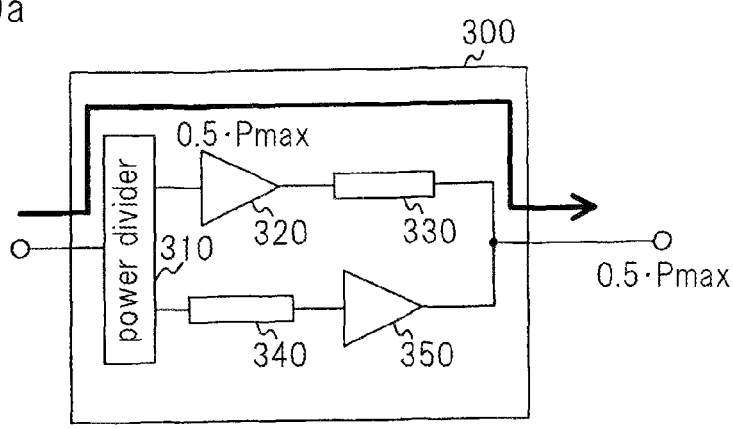
FIG. 10a is a diagram illustrating an operation of power amplifier 300 for amplifying a modulated signal when the pulse height of a pulse-modulated signal is "0.5".
Figure 10B:
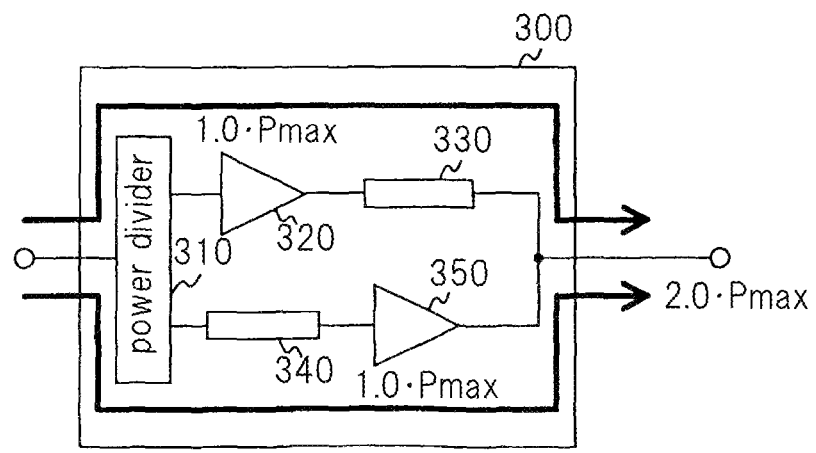
FIG. 10b is a diagram illustrating an operation of power amplifier 300 for amplifying a modulated signal when the pulse height of the pulse-modulated signal is "1.0".
Figure 10C:
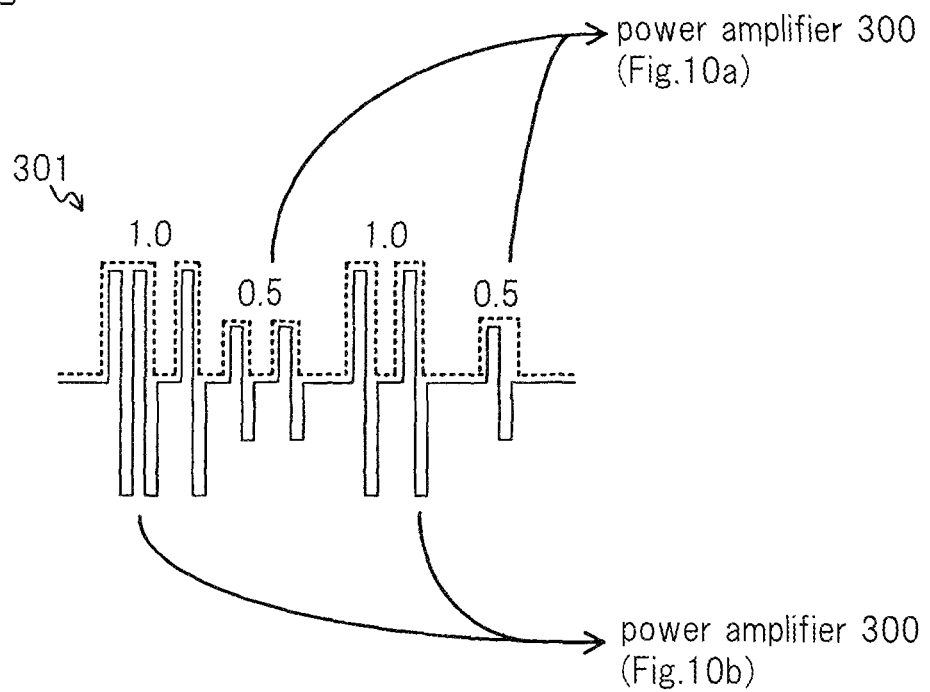
FIG. 10c is a diagram illustrating an example of a modulated signal provided to power amplifier 300.

FIG. 10 shows conceptual diagrams concerning the operation of power amplifier 300. It is assumed here that modulated signal 301 is provided through signal line 209. FIG. 10c is a diagram illustrating an example of modulated signal 301 provided to power amplifier 300 through signal line 209. In modulated signal 301, pulse signal train is represented by a solid line and an envelope of the modulated signal is represented by a dotted line. The envelope of the modulated signal corresponds to the pulse height of the pulse-modulated signal.

FIG. 10a is a diagram illustrating an operation of power amplifier 300 for amplifying modulated signal 301 when the pulse height of the pulse-modulated signal is "0.5". When modulated signal 301 while the pulse-height of the pulse-modulated signal is "0.5" is provided to power amplifier 300, only amplifier 320 operates and amplifier 350 does not operate, as illustrated in FIG. 10a.

Furthermore, when the normalized amplitude of the amplitude signal is 0.5, the duty ratio of the pulse-modulated signal corresponding to the envelope of the modulated signal is 100%. Accordingly, the output power of amplifier 320 is equal to 0.5·Pmax as described with reference to FIG. 2.

FIG. 10b is a diagram illustrating the operation of power amplifier 300 for amplifying modulated signal 301 when the pulse height of the pulse-modulated signal is "1.0". When modulated signal 301 while the pulse height of the pulse-modulated signal is "1.0" is provided to power amplifier 300, both amplifiers 320 and 350 operate as illustrated in FIG. 10b.

When the normalized amplitude of the amplitude signal is "1.0", the duty ratio of the pulse-modulated signal is 100%. Accordingly, power amplifier 300 outputs a saturation power of 2·Pmax.

Figure 11:
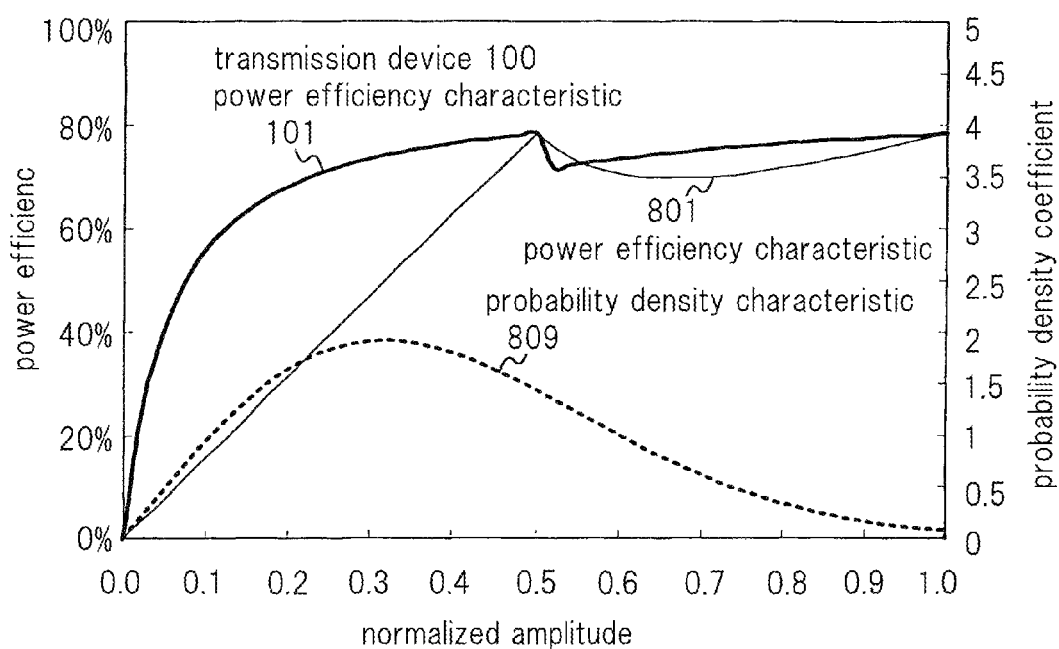
FIG. 11 is a diagram illustrating an example of a power efficiency characteristic of transmission device 100.

FIG. 11 is a diagram of a power efficiency characteristic versus normalized amplitude in transmission device 100. FIG. 11 shows power efficiency characteristic 101 of transmission device 100, power efficiency characteristic 801 of a conventional Doherty-type amplifier, and probability density characteristic 809. Here, the horizontal axis represents the normalized amplitude of an input signal. The normalized amplitude is an amplitude signal divided by the maximum amplitude of the amplitude signal.

Figure 2:
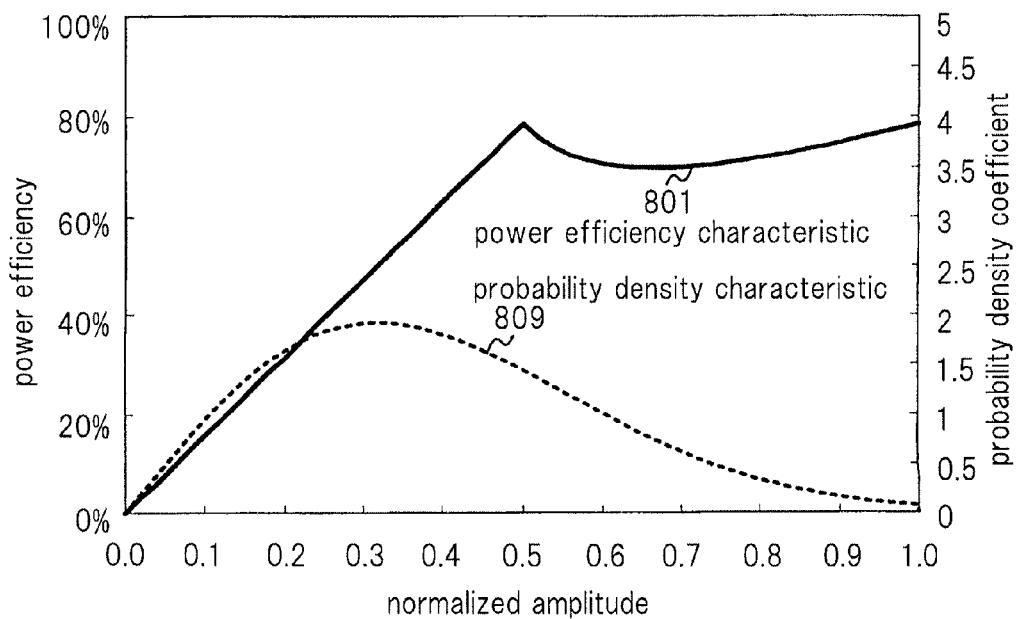
FIG. 2 is a diagram illustrating an example of a power efficiency characteristic of Doherty-type amplifier 820.

Power efficiency characteristic 801 and probability density characteristic 809 are similar to those illustrated in FIG. 2 and are therefore given the same reference numerals and thus description of these characteristics will be omitted here.

Power efficiency characteristic 101 represents a characteristic of the power efficiency versus the normalized amplitude of an amplitude signal in transmission device 100. Power efficiency characteristic 101 is a characteristic of the power efficiency when the maximum efficiency is assumed to be 78.5% and switching loss at each saturated output power of amplifiers 320 and 350 that are class D amplifiers is assumed to be 20%, for comparison with power efficiency characteristic 801.

When the normalized amplitude is less than or equal to 0.5, only amplifier 320 operates and therefore power efficiency characteristic 101 is higher than the power efficiency of Doherty-type amplifier 820. Since the switching loss is assumed to be 20%, power efficiency 101 gradually decreases as the normalized amplitude decreases and, at an amplitude of around "0.1", power efficiency 101 steeply decreases. This is because, as the normalized amplitude decreases, the duty ratio of the pulse-modulated signal decreases and accordingly the ratio of the switching loss of amplifier 320 to the output power of power amplifier 300 increases.

Furthermore, when the normalized amplitude is "0.5 (a back-off of 6 dB in terms of power)", the duty ratio of the pulse-modulated signal is 100%. Accordingly, power amplifier 300 outputs power equal to 0.5·Pmax and reaches its maximum power efficiency.

On the other hand, when the normalized amplitude is in the range which is greater than 0.5 and which is less than or equal to 1.0, both amplifiers 320 and 350 operate at maximum power efficiency. When the normalized amplitude is 1.0, the duty ratio of the pulse-modulated signal is 100% and power amplifier 300 reaches the saturated power, 2·Pmax, and therefore achieves maximum power efficiency.

Figure 1:
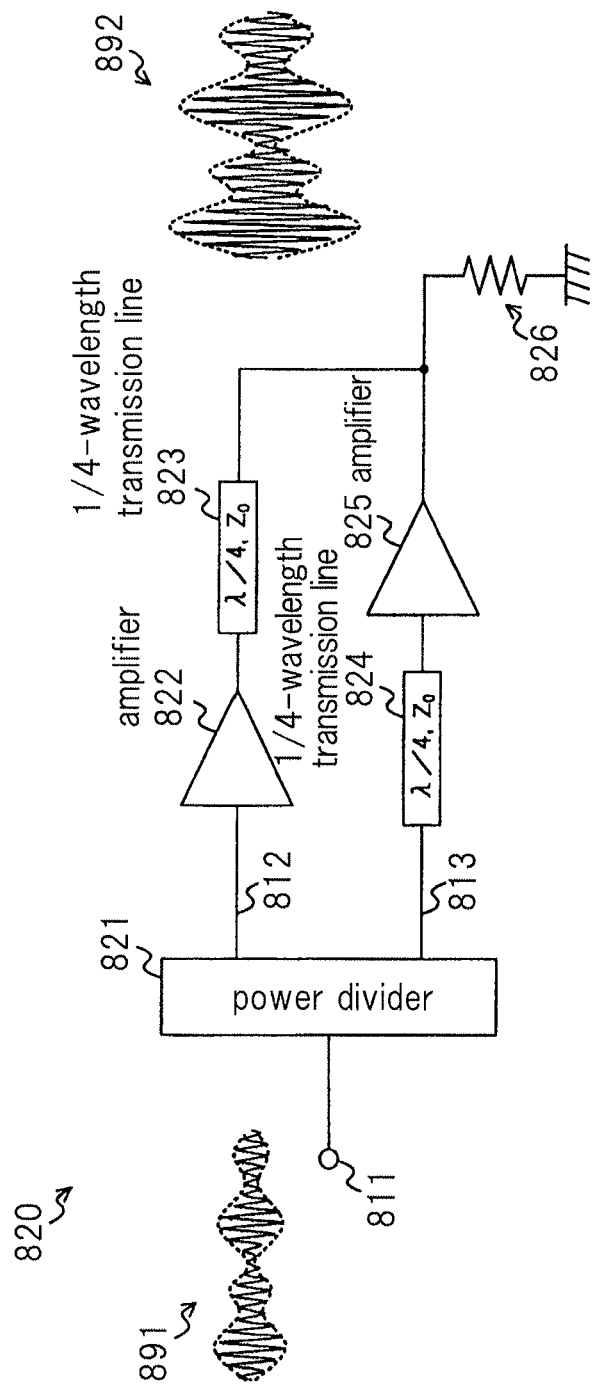
FIG. 1 is a block diagram illustrating an exemplary configuration of Doherty-type amplifier 820.

The average power efficiency based on probability density characteristic 809 is 72%, which is significantly higher than the average power efficiency (64%) of Doherty-type amplifier 820 described with reference to FIG. 1. This is because power efficiencies that correspond to normalized amplitudes that frequently appear have increased.

According to the first exemplary embodiment, pulse-modulated signal generator 201 generates a pulse-modulated signal by changing the width or density of a pulse according to the amplitude component of an input signal while changing the height of the pulse according to the amplitude component.

Thus, pulse-modulated signal generator 201 can reduce quantization noise which occurs during pulse-modulated signal generation and can generate a pulse-modulated signal that is an output signal having a high SN ratio. That is, transmission device 100 can generate an output signal having a high SN ratio over the wide dynamic range of an input signal.

In the first exemplary embodiment, pulse-modulated signal generator 201 reduces the saturation level of amplitude modulator 230 from "1.0" to "0.5" when the normalized amplitude of the input signal is less than or equal to "0.5". Accordingly, transmission device 100 can modulate an amplitude signal at a high SN ratio. Consequently, transmission device 100 can output an output signal having a good SN ratio as compared with delta-sigma modulator 863 illustrated in FIG. 4 even when the normalized amplitude is less than or equal to 0.5.

Furthermore, in the first exemplary embodiment, pulse-modulated signal generator 201 generates a pulse-modulated signal that can assume three values, 0.0, 0.5, and 1.0. Accordingly, transmission device 100 can improve the resolution of the amplitude signal from 1.0 to 1.5 bits as compared with delta-sigma modulator 863 illustrated in FIG. 4.

That is, transmission device 100 can improve the SN ratio of a signal to be output from transmission device 100 by approximately 3 dB. Accordingly, transmission device 100 can achieve the same SN ratio as delta-sigma modulator 863 illustrated in FIG. 4 even when the frequency of the sampling clock provided to delta-sigma modulator 260 is reduced by one half, thereby saving power consumption in transmission device 100.

Furthermore, in the first exemplary embodiment, power amplifier 300 includes as many amplifiers (amplifiers 320 and 350) as the number of discrete amplitude levels of a modulated signal. The number of operating amplifiers that amplify the modulated signal out of amplifies 320 and 350 increases as the amplitude level of the modulated signal increases.

Since power amplifier 300 includes a plurality of amplifiers 320 and 350 as described above, power amplifier 300 can disperse fixed power losses caused by factors such as switching losses that occur in overall power amplifier 300 between the two amplifiers. Power amplifier 300 reduces the number of operating amplifiers as the discrete amplitude level of modulated-signal decreases, thereby reducing power loss in power amplifier 300.

In the first exemplary embodiment, when power amplifier 300 accepts a modulated signal while the pulse height of the pulse-modulated signal is "0.5", only power amplifier 320 amplifies the modulated signal. Accordingly, in power amplifier 300, only amplifier 320 amplifies the amplitude signal when the normalized amplitude is less than or equal to "0.5". Therefore, power amplifier 300 can achieve improved power efficiency. Thus, transmission device 100 can operate power amplifier 300 with high power efficiency in a range where the normalized amplitude of the input signal is small.

Accordingly, transmission device 100 has high power efficiency in an operating region of power amplifier 300 in which the back-off is large, and can generate an output signal having a very small waveform distortion.

Furthermore, when power amplifier 300 accepts a modulated signal while the pulse height of the pulse-modulated signal is "1.0", amplifier 350 amplifies the modulated signal in addition to amplifier 320. Thus, transmission device 100 can operate power amplifier 300 with high power efficiency in a range where the normalized amplitude of the input signal is large. Therefore, transmission device 100 can amplify the input signal with high efficiency over a wide dynamic range.

According to the first exemplary embodiment, the gain of gain multiplier 232 increases as the amplitude component of the input signal decreases and the gain multiplier amplifies the amplitude component of the input signal with that gain. Delta-sigma modulator 260 applies delta-sigma modulation or pulse-width modulation to an output from gain multiplier 232 to generate a 1-bit signal.

Gain multiplier 233 amplifies the 1-bit signal output from delta-sigma modulator 260 with a gain equivalent to the reciprocal of the gain of gain multiplier 232 to generate a pulse-modulated signal.

In this way, amplitude modulator 230 can cause delta-sigma modulator 260 to operate near a saturation level even when the amplitude component of the input signal is small. Accordingly, quantization noise caused by delta-sigma modulator 260 can be reduced.

A variation of signal modulator 200 in transmission device 100 of the first exemplary embodiment will be described next.

Figure 12:
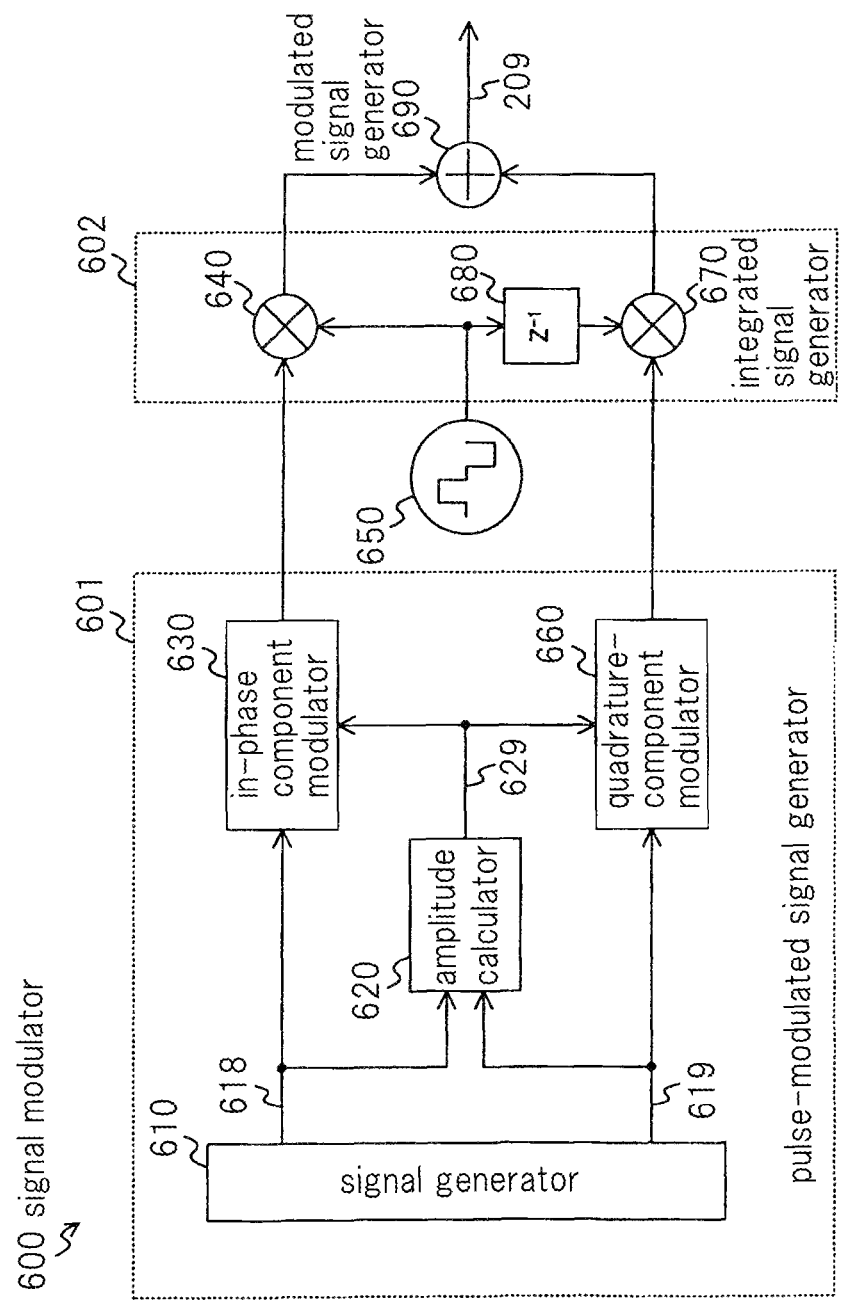
FIG. 12 is a block diagram illustrating an exemplary configuration of signal modulator 600 of a variation of the first exemplary embodiment.

FIG. 12 is a block diagram illustrating the variation of signal modulator 200 of the first exemplary embodiment.

Transmission device 100 of the variation of the first exemplary embodiment is a transmission device that amplifies and transmits an input signal that includes an I component and a Q component that are orthogonal to each other and has the I and Q components defined.

Signal modulator 600 includes pulse-modulated signal generator 601, clock signal generator 650, integrated signal generator 602, and modulated signal generator 690. Pulse-modulated signal generator 601 includes signal generator 610, amplitude calculator 620, in-phase component modulator 630, and quadrature-component modulator 660. Integrated signal generator 602 includes integrators 640 and 670 and delayer 680.

Pulse-modulated signal generator 601 is pulse-modulated signal generating means that generates a pulse-modulated signal in which the magnitude of an I component included in an input signal is represented by the width or density of a pulse and the heights of discrete pulses and a pulse-modulated signal in which the magnitude of a Q component included in the input signal is represented by the width or density of a pulse and the heights of discrete pulses.

Pulse-modulated signal generator 601 generates a pulse-modulated signal of the I component by changing the width or density of a pulse according to the magnitude of the I component while discretely changing the height of the pulse according to the magnitude of the amplitude component of the input signal.

At the same time, pulse-modulated signal generator 601 generates a pulse-modulated signal of the Q component by changing the width or density of a pulse according to the magnitude of the Q component while discretely changing the height of the pulse according to the magnitude of the amplitude component of the input signal.

Integrators 640 and 670, clock signal generator 650, delayer 680, and modulated-signal generator 690 are similar to those illustrated in FIG. 2 and therefore description of these components will be omitted here. Clock signal generator 650 can be generally called clock signal generating means. Modulated signal generator 690 can be generally called modulated signal generating means.

Signal generator 610 is similar to signal generator 210 illustrated in FIG. 6. Signal generator 610 provides an I signal, which is an I component of an input signal, to amplitude calculator 620 and in-phase-component modulator 630 through signal line 618. Signal generator 610 also provides a Q signal, which is a Q component of the input signal, to amplitude calculator 620 and quadrature-component modulator 660 through signal line 619.

Amplitude calculator 620 calculates the amplitude component of the input signal defined by the I component and the Q component from signal generator 610. For example, amplitude calculator 620 calculates the amplitude component of the input signal according to Equation 1. Amplitude calculator 620 provides the calculated amplitude component to in-phase-component modulator 630 and quadrature-component modulator 660 as an amplitude signal.

In-phase-component modulator 630 converts the I signal provided from signal generator 610 to a pulse-modulated signal. In-phase-component modulator 630 is similar to amplitude modulator 230 illustrated in FIG. 6.

In-phase-component modulator 630 generates an in-phase pulse signal by changing the width or density of a pulse according to the magnitude of the I component while discretely changing the height of the pulse according to the magnitude of the amplitude component provided from amplitude calculator 620.

For example, in-phase-component modulator 630 applies delta-sigma modulation or pulse-wide modulation to the I signal with a saturation level that corresponds to the magnitude of the amplitude signal to generate an in-phase pulse signal.

In-phase-component modulator 630 can be implemented with a configuration similar to that of amplitude modulator 230 illustrated in FIG. 8, for example. In this case, the amplitude signal from signal line 629 is provided to gain setter 231 and the I signal from signal line 618 is provided to gain multiplier 232.

Gain setter 231 compares the magnitude of the normalized amplitude, which is an amplitude signal normalized on the basis of a maximum level of the amplitude signal of "1.0", with a threshold amplitude, which has been set to "0.5". When the normalized amplitude is less than or equal to "0.5", gain setter 231 sets "2.0" in gain multiplier 232 and sets "0.5" in gain multiplier 233.

On the other hand, when the magnitude of the normalized magnitude exceeds 0.5, gain setter 231 selects a gain coefficient of "1.0". In this case, gain setter 231 sets the selected gain coefficient, "1.0", in gain multiplier 232 and sets the reciprocal, "1.0", of the gain coefficient in gain multiplier 233.

The configuration of in-phase-component modulator 630 is similar to that illustrated in FIG. 8, except gain setter 231, and therefore description of in-phase-component modulator 630 will be omitted here. In this case, gain multipliers 232 and 233 can be generally called first variable-gain amplifying means and second variable-gain amplifying means, respectively. Delta-sigma modulator 260 can be generally called first modulating means. An example of the in-phase pulse signal generated by in-phase-component modulator 630 on the basis of an amplitude signal is shown in FIG. 13.

Figure 13A:
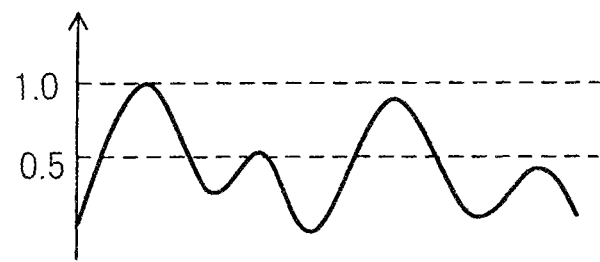
FIG. 13a is a diagram illustrating an example of an amplitude signal output from amplitude calculator 620.

FIG. 13a is a diagram illustrating an example of an amplitude signal provided in signal line 629. The amplitude signal has the same waveform as the amplitude signal illustrated in FIG. 7a.

Figure 13B:
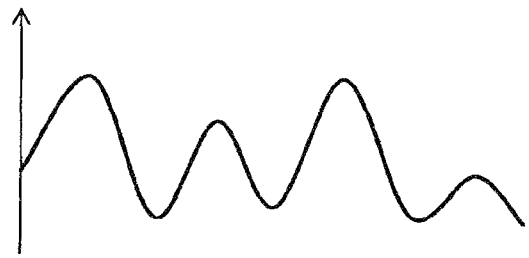
FIG. 13b is a diagram illustrating an example of an I signal output from signal generator 610.
Figure 13C:
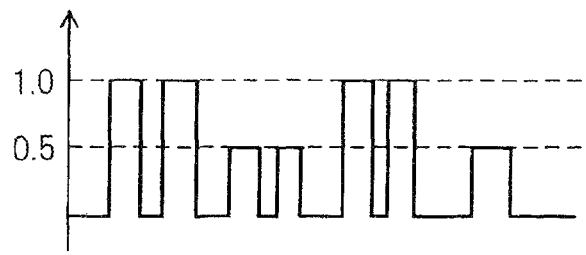
FIG. 13c is a diagram illustrating an in-phase pulse signal generated on the basis of the I signal and the amplitude signal.

FIG. 13b is a diagram illustrating an example of an I signal provided in signal line 618. FIG. 13c is a diagram illustrating an example of an in-phase pulse signal generated on the basis of the I signal illustrated in FIG. 13b and the amplitude signal illustrated in FIG. 13a. In FIGS. 13a to 13c, the horizontal axis represents time and the vertical axis represents the magnitude of amplitude.

Quadrature-component modulator 660 converts a Q signal provided from signal generator 610 to a pulse-modulated signal. Quadrature-component modulator 660 is similar to amplitude modulator 230 illustrated in FIG. 6.

Quadrature-component modulator 660 generates a quadrature pulse signal, which is a pulse-modulated signal, by changing the width or density of a pulse according to the magnitude of the I signal while discretely changing the height of the pulse according to the magnitude of an amplitude component provided from amplitude calculator 620.

For example, quadrature-component modulator 660 applies delta-sigma modulation or pulse-width modulation to the Q signal with a saturation level that corresponds to the magnitude of the amplitude signal to generate a quadrature pulse signal.

Quadrature-component modulator 660 can be implemented with a configuration similar to that of amplitude modulator 230 illustrated in FIG. 8. In this case, the amplitude signal from signal line 629 is provided to gain setter 231 and a quadrature signal from signal line 619 is provided to gain multiplier 232.

Operation of quadrature-component modulator 660 is similar to that of in-phase-component modulator 630 described above and therefore description of the operation will be omitted here. Gain multipliers 232 and 233 making up quadrature-component modulator 660 can be generally called third variable-gain amplifying means and fourth variable-gain amplifying means, respectively. Delta-sigma modulator 260 can be generally called second modulating means. An example of a quadrature pulse signal generated by quadrature-component modulator 660 on the basis of an amplitude signal is illustrated in FIG. 13.

Figure 13D:
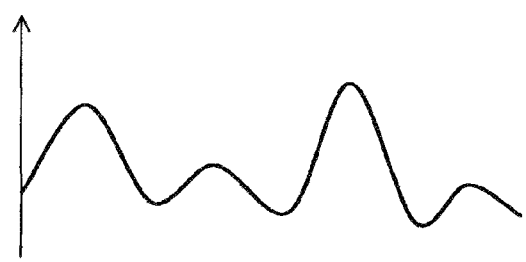
FIG. 13d is a diagram illustrating a Q signal output from signal generator 610.
Figure 13E:
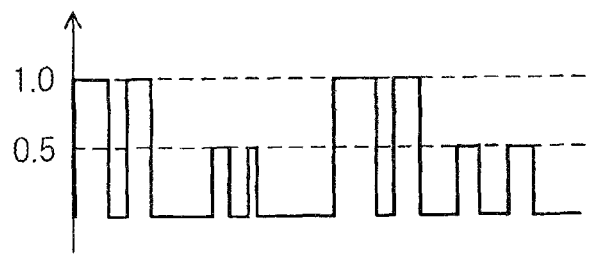
FIG. 13e is a diagram illustrating a quadrature pulse signal generated on the basis of the Q signal and the amplitude signal.
Figure 13F:
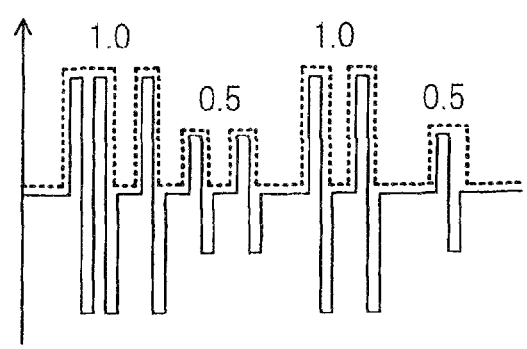
FIG. 13f is a diagram illustrating a modulated signal generated by modulated signal generator 690.

FIG. 13d is a diagram illustrating an example of a Q signal provided onto signal line 619. FIG. 13e is a diagram illustrating an example of a quadrature-pulse signal generated on the basis of the Q signal illustrated in FIG. 13d and the amplitude signal illustrated in FIG. 13a. FIG. 13f is a diagram illustrating a modulated signal generated by modulated signal generator 690. In FIGS. 13d and 13f, the horizontal axis represents time and the vertical axis represents the magnitude of amplitude.

Integrated signal generator 602 is integrated signal generating means that integrates a clock signal from clock signal generator 650 and an in-phase pulse signal from in-phase-component modulator 630 to generate a first integrated signal, and integrates a signal that is a clock signal from clock signal generator 650 delayed by 1 clock period and a quadrature-pulse signal from quadrature-component modulator 660 to generate a second integrated signal.

Modulated signal generator 690 adds the first integrated signal and the second integrated signal from integrated signal generator 602 together to generate a modulated signal whose amplitude level discretely changes according to the pulse heights of pulse-modulated signals of I and Q components.

In signal modulator 600, in-phase-component modulator 630 and quadrature-component modulator 660 generate an in-phase pulse signal and a quadrature pulse signal on the basis of the magnitude of an amplitude signal. In this way, signal modulator 600 can generate a modulated-signal having two discrete amplitude levels.

Signal modulator 600 can generate a modulated signal in which I and Q signals are superimposed on the clock in the order, I, Q, −I, −Q, and which has discrete two amplitude levels.

In signal modulator 600 according to the variation of the first exemplary embodiment, modulated signal generator 690 adds the first integrated signal and the second integrated signal from integrated signal generator 602 together. In this way, signal modulator 600 can generate a pulse-modulated signal having two discrete amplitude levels.

Consequently, modulated signal generator 690 can reduce quantization noise that occurs during pulse modulated signal generation and can generate a modulated signal having a high SN ratio.

A transmission device according to a second exemplary embodiment will be described next with reference to drawings.

Figure 14:
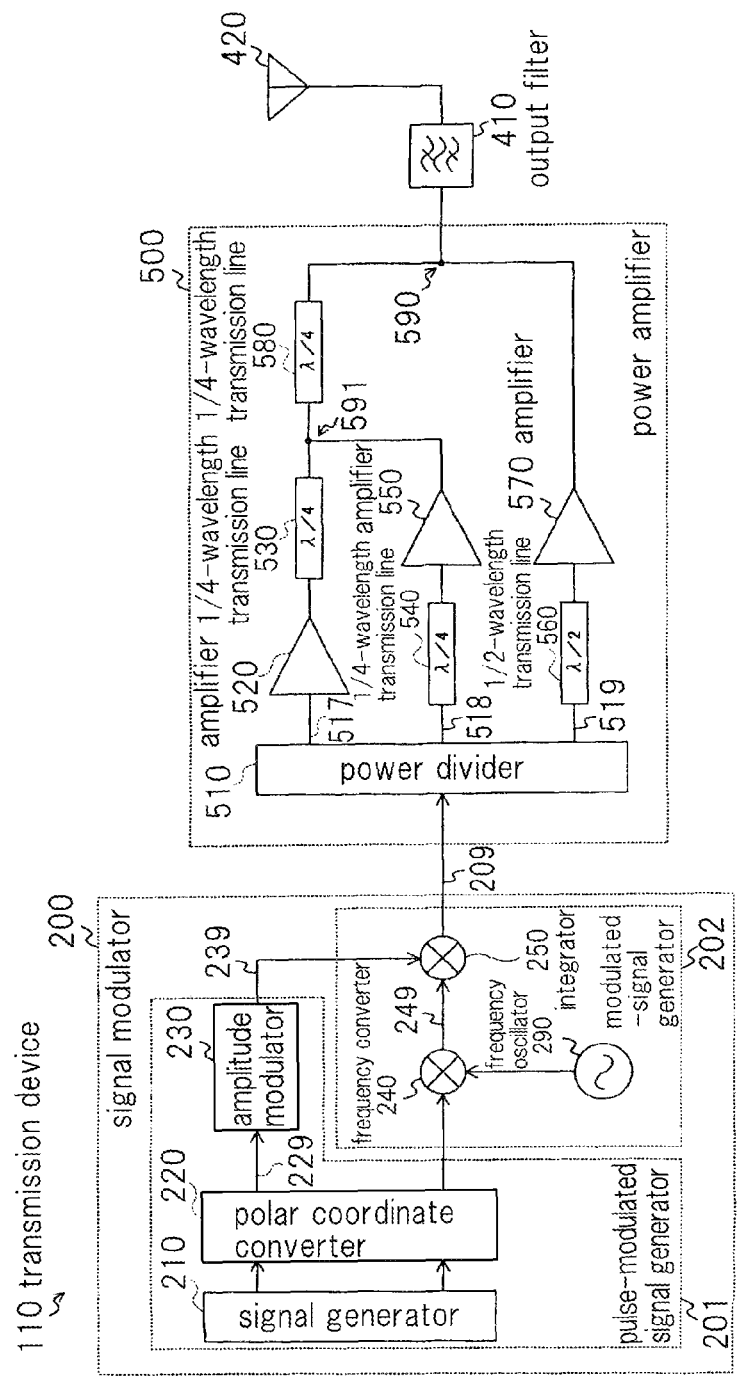
FIG. 14 is a block diagram illustrating an exemplary configuration of transmission device 110 according to a second exemplary embodiment.

FIG. 14 is a block diagram illustrating an exemplary configuration of transmission device 110. Transmission device 110 includes power amplifier 500, in place of power amplifier 300 in transmission device 100 illustrated in FIG. 6.

In the second exemplary embodiment, amplitude modulator 230 generates a pulse-modulated signal that can assume four amplitude levels, "0.0", "0.25", "0.5" and "1.0", on the basis of the magnitude of an amplitude signal when a saturation level of delta-sigma modulator 260 is normalized to "1.0".

That is, amplitude modulator 230 generates a pulse-modulated signal that assume three saturation levels, "0.25", "0.5" and "1.0", according to the magnitude of an amplitude signal.

Amplitude modulator 230 can be implemented with the configuration illustrated in FIG. 8, for example. In this case, gain setter 231 normalizes the maximum level of the amplitude signal to "1.0" and compares the magnitude of the normalized amplitude with two threshold amplitudes, "0.25" and "0.5".

Gain setter 231 selects a gain coefficient of "4.0" when the magnitude of the normalized amplitude is less than or equal to "0.25". Gain setter 231 sets the selected gain coefficient, "4.0", in gain multiplier 232 and sets the reciprocal, "0.25", of the gain coefficient in gain multiplier 233.

On the other hand, when the magnitude of the normalized amplitude is greater than "0.25" and less than or equal to "0.5", gain setter 231 selects a gain coefficient of "0.5". Gain setter 231 sets the selected gain coefficient, "2.0", in gain multiplier 232 and sets the reciprocal, "0.5", of the gain coefficient in gain multiplier 233.

When the magnitude of the normalized amplitude exceeds "0.5", gain setter 231 selects a gain coefficient of "1.0". Gain setter 231 sets the selected gain coefficient, "1.0", in gain multiplier 232 and sets the reciprocal, "1.0", of the gain coefficient in gain multiplier 233.

The configuration is similar to that described with reference to FIG. 8, except gain setter 231, and therefore description of the configuration will be omitted here.

Power amplifier 500 is power amplifying means that amplifies a modulated signal whose amplitude level discretely changes according to three saturation levels of a pulse-modulated signal from modulated-signal generator 202. Power amplifier 300 has as many amplifiers as the number of the discrete amplitude levels of the modulated signal, namely three amplifiers 520, 550 and 570.

The number of operating amplifiers that amplify a modulated signal out of amplifiers 520, 550 and 570 in power amplifier 500 increases as the amplitude level of the modulated signal increases. Power amplifier 500 combines outputs from the operating amplifiers and outputs the combined signal.

According to the second exemplary embodiment, when power amplifier 500 accepts a modulated signal having an amplitude level corresponding to a pulse height of the pulse-modulated signal of "0.25", one operating amplifier (amplifier 520) operates.

When power amplifier 500 accepts a modulated signal having an amplitude level corresponding to a pulse height of the pulse-modulated signal of "0.5", two operating amplifiers (amplifiers 520 and 550) operate and the power amplifier 500 combines outputs from the amplifiers and outputs the combined signal.

When power amplifier 500 accepts a modulated signal having an amplitude level corresponding to a pulse height of the pulse-modulated signal of 1.0, three operating amplifiers (amplifiers 520, 550 and 570) operate and power amplifier 500 combines outputs from these amplifiers and outputs the combined signal.

Power amplifier 500 includes power divider 510, ¼-wavelength transmission lines 530, 540 and 580, and ½-wavelength transmission line 560, in addition to amplifiers 520, 550 and 570.

In power amplifier 500, amplifier 520 has an input end connected to power divider 510 and an output end connected to one end of ¼-wavelength transmission line 530. ¼-wavelength transmission line 540 has one end connected to power divider 510 and the other end connected to an input end of amplifier 550.

½-wavelength transmission line 560 has an end connected to power divider 510 and the other end connected to an input end of amplifier 570. ¼-wavelength transmission line 580 has an end connected to the other end of ¼-wavelength transmission line 530 and an output end of amplifier 550 through combiner 591, and the other end connected to an output end of amplifier 570 and output filter 410 through combiner 590.

Power amplifier 500 is a 3-way Doherty-type amplifier. Amplifiers 520 and 550, ¼-wavelength transmission lines 530 and 540, and combiner 591 are similar to amplifiers 320 and 350, ¼-wavelength transmission lines 330 and 340, and combiner 360 illustrated in FIG. 6 and therefore description of these components will be omitted here.

In the second exemplary embodiment, amplifier 520 is biased to operate when a modulated signal is provided through signal line 209 while the pulse height of the pulse-modulated signal is greater than or equal to "0.25". Amplifier 520 is configured so that its power efficiency peaks when a modulated signal is provided while the pulse height of the pulse-modulated signal is greater than or equal to "0.25".

Amplifier 550 is biased to operate when a modulated signal is provided through signal line 209 when the pulse height of the pulse-modulated signal is greater than or equal to "0.5". Amplifier 550 is configured so that its power efficiency peaks when a modulated signal is provided while the pulse height of the pulse-modulated signal is greater than or equal to "0.5".

Power divider 510 divides the power of a modulated signal from signal line 209 into three. Power divider 510 provides the resulting three modulated signals to amplifiers 520, ¼-wavelength transmission line 540, and ½-wavelength transmission line 560 through signal lines 517 to 519, respectively.

½-wavelength transmission line 560 is a ½-wavelength impedance transformer. Transmission line 560 outputs a modulated signal from signal line 519 to amplifier 570. ¼-wavelength transmission line 580 is a ¼-wavelength impedance transformer. Transmission line 580 outputs modulated signals from signal lines 517 and 518 to output filter 410 through combiner 590.

Amplifier 570 is a peak amplifier biased to operate in class C. Amplifier 570 has a configuration similar to amplifier 350. Amplifier 570 is biased to operate when a modulated signal when the pulse height of the pulse-modulated signal is "1.0" is provided through signal line 209.

Amplifier 570 is configured so that its power efficiency peaks when a modulated signal is accepted while the pulse height of the pulse-modulated signal is "1.0". Accordingly, amplifier 570 amplifies a modulated signal with maximum efficiency when the pulse height of the pulse-modulated signal is "1.0".

Furthermore, amplifier 570 operates on a modulate signal when the pulse height of the pulse-modulated signal is "1.0" but does not operate on a modulated signal when the pulse height of the pulse-modulated signal is "0.25" or "0.5".

Amplifier 570 may be a switching mode amplifier, for example.

Amplifier 570 outputs the amplified modulated signal to output filter 410 through combiner 590. Amplifier 570 can be generally called amplifying means or operating amplifying means.

Combiner 590 combines a modulated signal from ¼-wavelength transmission line 580 with a modulated signal from amplifier 570.

FIG. 15 is a diagram illustrating exemplary waveforms of signals generated by transmission device 110. Here, the horizontal axis represents time and the vertical axis represents the magnitude of amplitude.

Figure 15A:
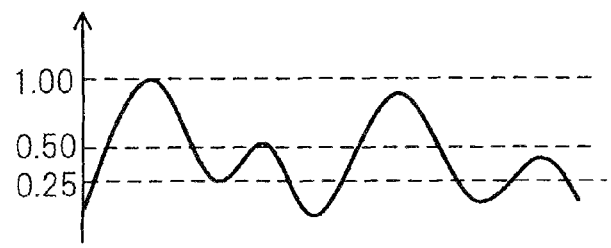
FIG. 15a is a diagram illustrating an example of an amplitude signal provided to amplitude modulator 230.
Figure 15B:
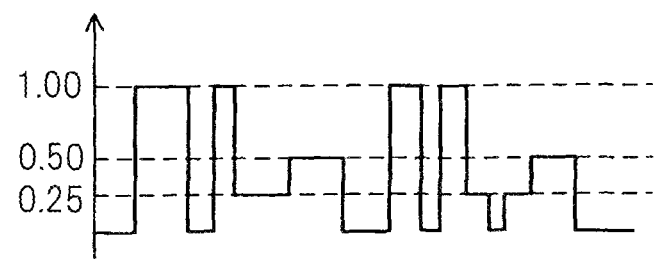
FIG. 15b is a diagram illustrating a pulse-modulated signal generated on the basis of the amplitude signal.

FIG. 15a is a diagram illustrating an example of an amplitude signal provided onto signal line 229. FIG. 15b is a diagram illustrating an example of a pulse-modulated signal generated on the basis of the amplitude signal illustrated in FIG. 15a.

Figure 15C:
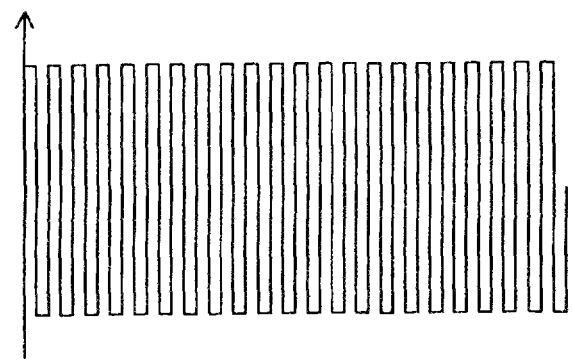
FIG. 15c is a diagram illustrating an example of a phase-modulated signal output from frequency converter 240.
Figure 15D:
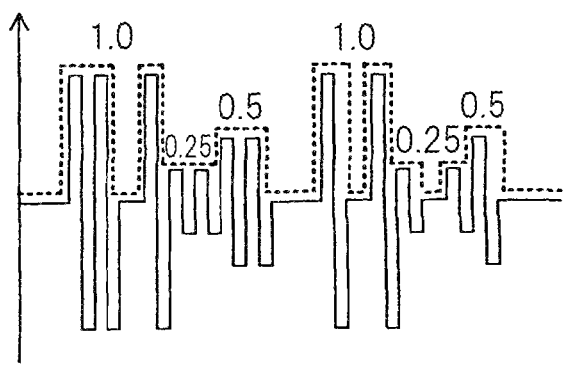
FIG. 15d is a diagram illustrating a modulated signal generated on the basis of the pulse-modulated signal and the phase-modulated signal.

FIG. 15c is a diagram illustrating an example of a phase-modulated signal provided through signal line 249. FIG. 15d is a diagram illustrating an example of a modulated-signal generated on the basis of the pulse-modulated signal and the phase-modulated signal illustrated in FIGS. 15b and 15c, respectively. In FIG. 15d, the modulated signal is represented by a solid line and an envelope of the modulated signal is represented by a dotted line.

Figure 15E:
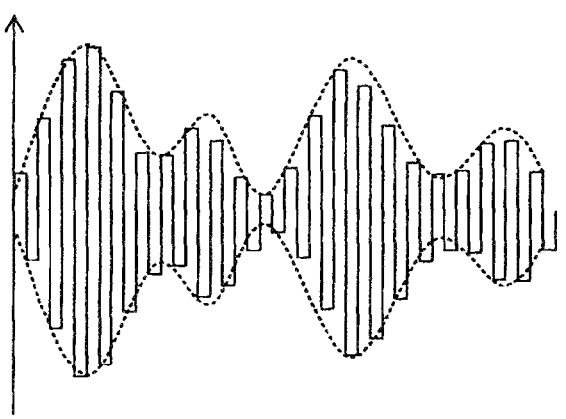
FIG. 15e is a diagram illustrating a modulated signal from which a square-wave component has been eliminated by output filter 410.

FIG. 15e is a diagram illustrating an example of a modulated signal generated by amplifying the modulated signal illustrated in FIG. 15d by power amplifier 500 and then eliminating the square-wave component by output filter 410. Here, the modulated signal is represented by a solid line and an envelope of the modulated signal is represented by dotted curves.

It can be seen that the waveform of the envelope of the modulated signal represented by the dotted curves in FIG. 15e approximates the waveform of the amplitude signal illustrated in FIG. 15a.

Figure 16:
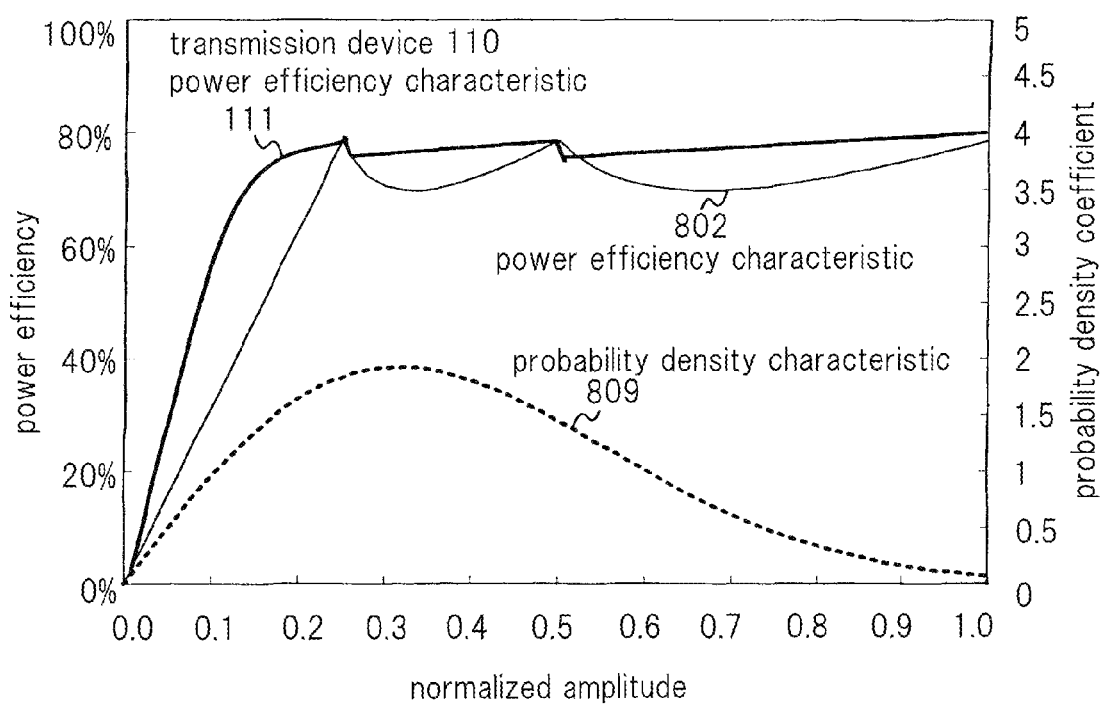
FIG. 16 is a diagram illustrating an example of a power efficiency characteristic of transmission device 110.

FIG. 16 is a diagram illustrating the power efficiency characteristic versus the normalized amplitude of an amplitude signal in transmission device 110. FIG. 16 illustrates power efficiency characteristic 111 of transmission device 110, power efficiency characteristic 802 of a conventional 3-way Doherty-type amplifier for comparison with power efficiency characteristic 111, and probability density characteristic 809.

Probability density characteristic 809 is the same as that in FIG. 2 and therefore is given the same reference numeral and thus description of probability density characteristic 809 will be omitted here. Power efficiency characteristic 802 represents a characteristic of the power efficiency of a 3-way Doherty-type amplifier that amplifies a modulated signal having a continuously changing envelope.

Power efficiency characteristic 111 represents a characteristic of power efficiency versus normalized amplitude of an amplitude signal in transmission device 110. Power efficiency characteristic 111 is a characteristic of power efficiency when the maximum efficiency of transmission device 110 is assumed to be 78.5% and switching loss at each saturated output power of amplifiers 520, 550 and 570 that are class D amplifiers is assumed to be 20%, for comparison with power efficiency characteristic 802.

When the normalized amplitude is in the range which is greater than or equal to "0.00" and which is less than or equal to "0.25", the power efficiency in power efficiency characteristic 111 is higher than power efficiency characteristic 802. When the normalized amplitude is "0.25 (a back-off of 12 dB in terms of power)", the duty ratio of the pulse-modulated signal with a pulse height of the pulse-modulated signal of "0.25" is 100%. Accordingly, the power efficiency of transmission device 110 is at the maximum (78.5%).

When the normalized amplitude is in the range which is greater than "0.25" and which is less than or equal to "0.5", the pulse height of the pulse-modulated signal is set to "0.5". In this range, both of amplifiers 520 and 550 operate.

Therefore, even if switching loss of amplifiers 520 and 550 that are class D amplifiers is assumed to be 20%, transmission device 110 can achieve higher power efficiency than power efficiency characteristic 802. Furthermore, when the normalized amplitude is "0.5 (a back-off of 6 dB in terms of power)", the duty ratio of the pulse-modulated signal is 100% and accordingly the power efficiency reaches the maximum (78.5%).

When the normalized amplitude is greater than "0.5", the pulse height of the pulse-modulates signal is set to "1.0" and all of amplifiers 520, 550 and 570 operate. Accordingly, even if the switching loss of amplifiers 520, 550 and 570 that are class D amplifiers is assumed to be 20%, transmission device 110 can achieve higher power efficiency than power efficiency characteristic 802.

When the normalized amplitude is "1.0", the duty ratio of the pulse-modulated signal is 100% and the power efficiency is at the maximum (78.5%).

According to the second exemplary embodiment, pulse-modulated signal generator 201 generates a pulse-modulated signal that assumes three saturation levels on the basis of an amplitude signal, thereby quantization noise associated with delta-sigma modulation in amplitude modulator 230 can be further reduced as compared with the first exemplary embodiment. Accordingly, transmission device 110 can further improve the SN ratio of an output signal to be output from antenna 420.

Furthermore, according to the second exemplary embodiment, pulse-modulated signal generator 201 can modulate an amplitude signal under a high SN ratio condition because the saturation level of amplitude modulator 230 is decreased to "0.25" or "0.5" when the normalized amplitude of the input signal is less than or equal to "0.5". Therefore, transmission device 110 can output an output signal having a good SN ratio when the normalized amplitude is less than or equal to "0.5", as compared with delta-sigma modulator 863 illustrated in FIG. 4.

Specifically, when amplitude modulator 230 generates a pulse-modulated signal that assumes four pulse height values, "0.00", "0.25", "0.50" and "1.00", the resolution of an amplitude signal can be improved from 1 bit to 2 bits as compared with delta-sigma modulator 863.

That is, transmission device 110 can improve the SN ratio of an output signal by approximately 6 dB. Accordingly, even when the frequency of the sampling clock to be provided to delta-sigma modulator 260 is set to ¼, an SN ratio equal to that of delta-sigma modulator 863 illustrated in FIG. 4 can be ensured and power consumption in transmission device 110 can be saved.

Furthermore, according to the second exemplary embodiment, since power amplifier 500 includes three amplifiers 520, 550 and 570, output power loss caused by switching loss of power amplifier 500 or other factors can be further dispersed. Accordingly, transmission device 110 can achieve further improved power efficiency in the normalized amplitude range of "0.0" to "0.5" as compared with the first exemplary embodiment.

Thus, transmission device 110 has a higher power efficiency in an operating region in which the back-off in power amplifier 500 is larger than in the first embodiment and can generate an output signal having a smaller waveform distortion than in the first exemplary embodiment.

A transmission device according to a third exemplary embodiment will be described next with reference to drawings.

Figure 17:
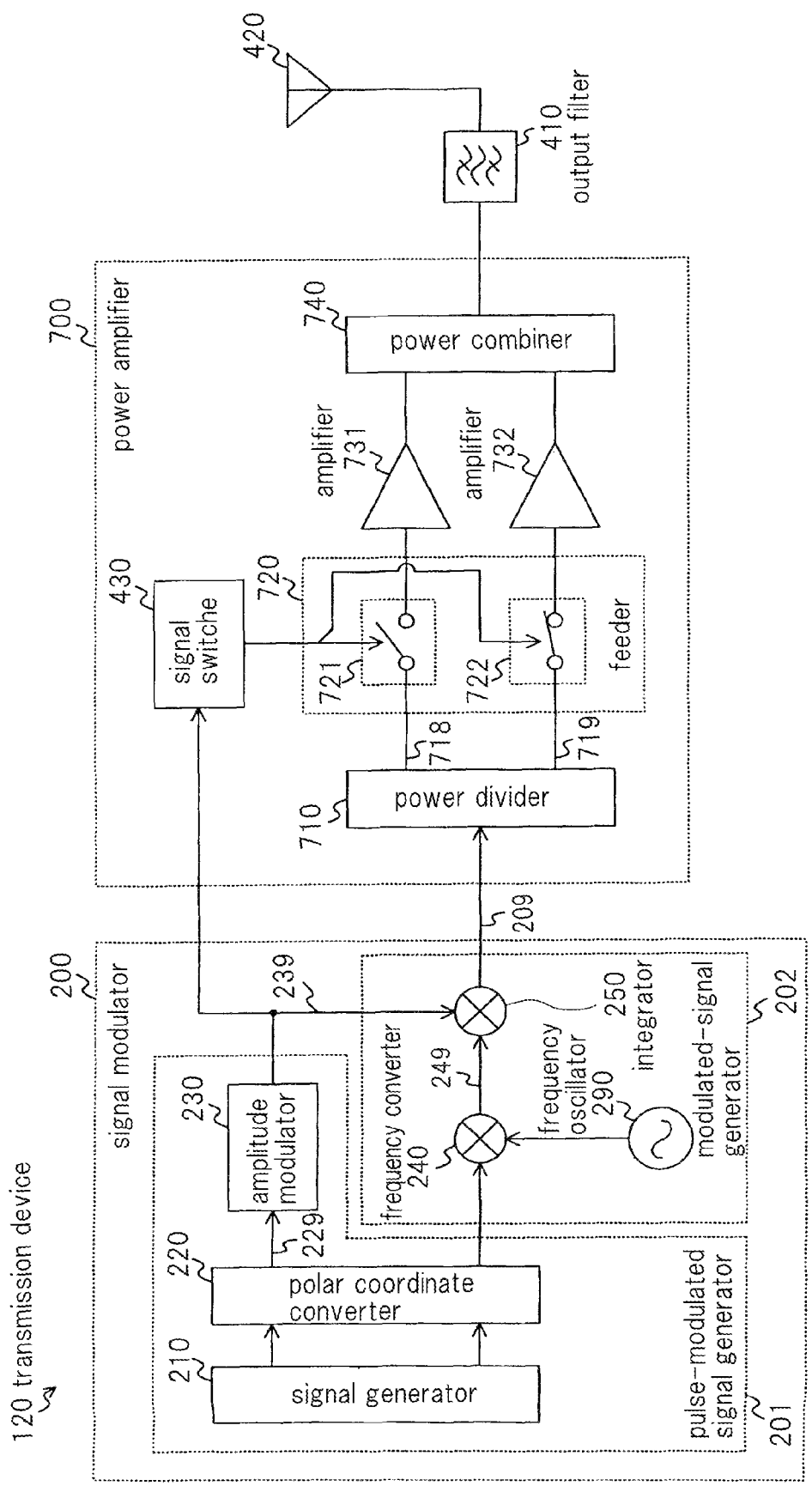
FIG. 17 is a block diagram illustrating an exemplary configuration of transmission device 120 according to a third exemplary embodiment.

FIG. 17 is a block diagram illustrating an exemplary configuration of transmission device 120 according to the third exemplary embodiment. Transmission device 120 includes power amplifier 700 in place of power amplifier 300 in transmission device 100 illustrated in FIG. 6. Output filter 410 and antenna 420 are similar to those illustrated in FIG. 6 and therefore are given the same numerals and thus description of these components will be omitted here.

Signal modulator 200 multiplies a phase modulated signal by a pulse modulated signal whose amplitude component is subjected to delta-sigma modulation with one of two saturation levels that correspond to the amplitude component of the input signal as described with reference to FIG. 6. The modulated signal is a signal that has an amplitude level that discretely changes according to the pulse height of the pulse-modulated signal that has two pulse height values, "0.5" and "1.0".

Signal modulator 200 have a configuration similar to the configuration illustrated in FIG. 6, therefore its components are given the same numerals and description of the configuration will be omitted.

Power amplifier 700 is power amplifying means that amplifies a modulated signal generated by signal modulator 200. Power amplifier 700 includes signal switcher 430, power divider 710, feeder 720, amplifiers 731 and 732, and power combiner 740. Feeder 720 includes switches 721 and 722. Power divider 710 is similar to power divider 310 illustrated in FIG. 6 and therefore description of power divider 710 will be omitted here.

Signal switcher 430 is control means that controls, for each of amplifiers 731 and 732, whether or not a modulated signal is to be amplified by the amplifier, on the basis of the pulse height (amplitude level) of a pulse-modulated signal that is equivalent to the discrete amplitude level of the modulated signal.

Signal switcher 430 generates a control signal for switching between connection and disconnection of switches 721 and 722, on the basis of the pulse height of a pulse-modulated signal from signal line 239. That is, signal switcher 430 generates a control signal on the basis of the amplitude level of the modulated signal that is equivalent to the pulse height of the pulse-modulated signal.

When the pulse height of the pulse-modulated signal is "0.5", signal switcher 430 provides a conduction signal for placing switch 721 in a conduction state and a non-conduction signal for placing switch 722 in non-conduction state to switches to 721 and 722, respectively, as control signals.

On the other hand, when the pulse height of the pulse-modulated signal is "1.0", signal switcher 430 provides a conduction signal for placing switch 721 in the conduction state and a conduction signal for placing switch 722 in the conduction state to switches 721 and 722 as control signals.

Feeder 720 provides modulated signals to amplifiers 731 and 732 according to control signals from signal switcher 430.

Switch 721 switches between connection and disconnection between power divider 710 and amplifier 731. When switch 721 accepts a conduction signal from signal switcher 430, switch connects power divider 710 to amplifier 731. That is, when switch 721 accepts a conduction signal from signal switcher 430, switch 721 provides a modulated signal from signal line 718 to amplifier 731.

When switch 721 accepts a non-conduction signal from signal switcher 430, switch 721 disconnects amplifier 731 from power divider 710. That is, when switch 721 accepts a non-conduction signal from signal switcher 430, switch 721 prevents a modulated signal from signal line 718 from being provided to amplifier 731.

Switch 722 switches between connection and disconnection between power divider 710 and amplifier 732. When switch 722 accepts a conduction signal from signal switcher 430, switch 722 connects power divider 710 to amplifier 732. That is, when switch 721 accepts a conduction signal from signal switcher 430, switch 721 provides a modulated signal from signal line 719 to amplifier 732.

When switch 722 accepts a non-conduction signal from signal switcher 430, switch 722 disconnects power divider 710 from amplifier 732. That is, when switch 722 accepts a non-conduction signal from signal switcher 430, switch 722 prevents a modulated signal from signal line 719 from being provided to amplifier 732.

Amplifiers 731 and 732 are amplifying means or operating amplifying means that amplify modulated signals provided from switches 721 and 722, respectively. Amplifiers 731 and 732 are configured to provide their maximum power efficiencies when a modulated signal is provided while the pulse height of a pulse-modulated signal is, for example, "0.5".

Amplifiers 731 and 732 may be implemented by class D amplifiers, for example. Amplifiers 731 and 732 provide amplified modulated signals to power combiner 740.

Power combiner 740 combines modulated signals from amplifiers 731 and 732. Power combiner 740 outputs the power-combined modulated signal to output filter 410.

In this way, when the pulse height of the pulse-modulated signal is "0.5", signal switcher 430 provides the conduction signal only to switch 721 to cause only amplifier 731 to amplify the modulated signal.

When pulse height of the pulse-modulated signal is "1.0", signal switcher 430 provides the conduction signal to both switches 721 and 722 to cause both amplifiers 731 and 732 to amplify the modulated signal.

According to the third exemplary embodiment, signal switcher 430 controls provision of the modulated signal to amplifiers 731 and 732 on the basis of the pulse height of the pulse-modulated signal that is equivalent to a discrete amplitude level of the modulated signal. Accordingly, when power amplifier 700 accepts a modulated signal while the pulse height of the pulse-modulated signal is "0.5", power amplifier 700 can amplify the modulated signal with only one operating amplifier (amplifier 731).

Figure 4:
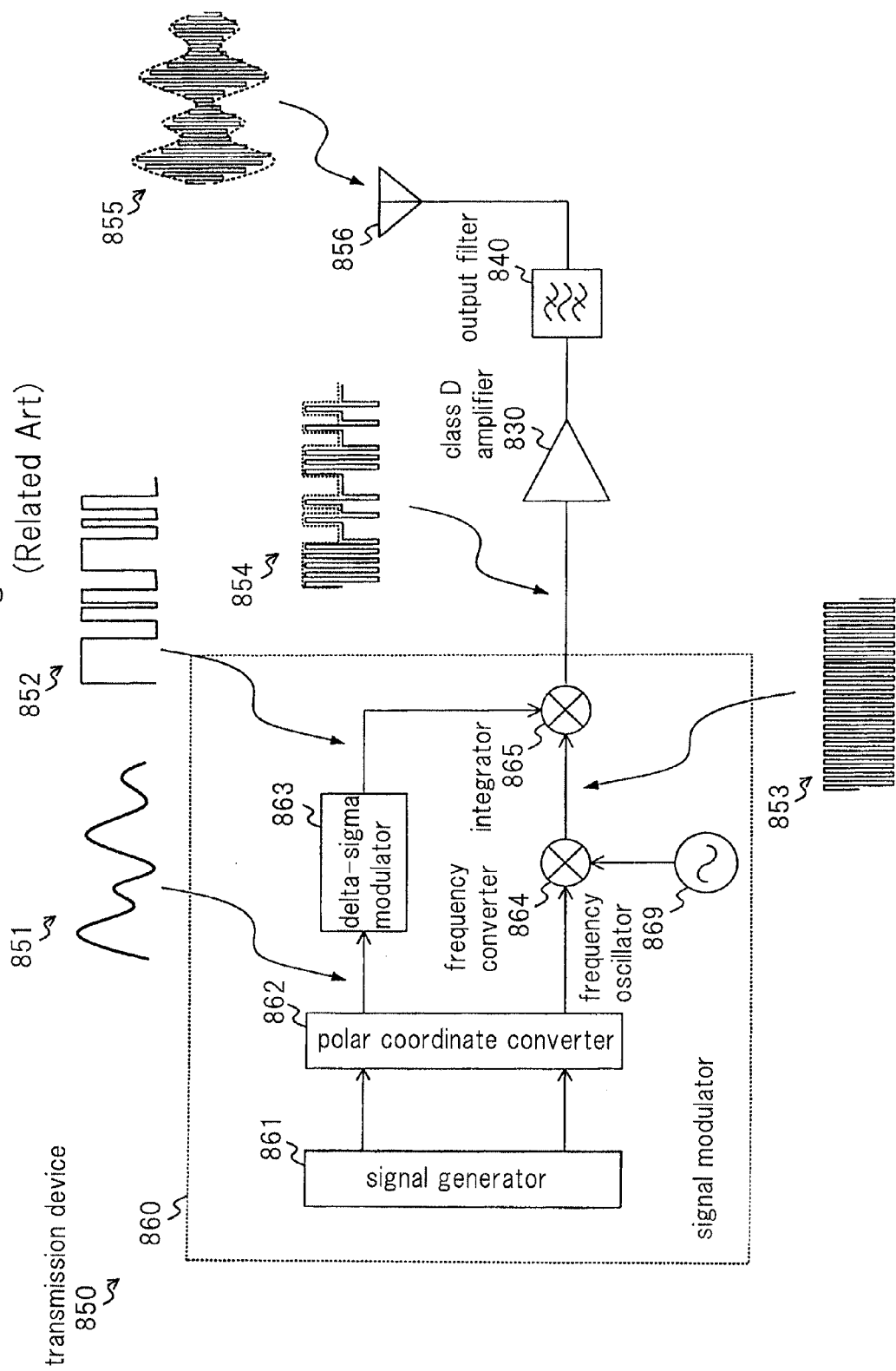
FIG. 4 is a block diagram illustrating an exemplary configuration of transmission device 850.
Figure 5:
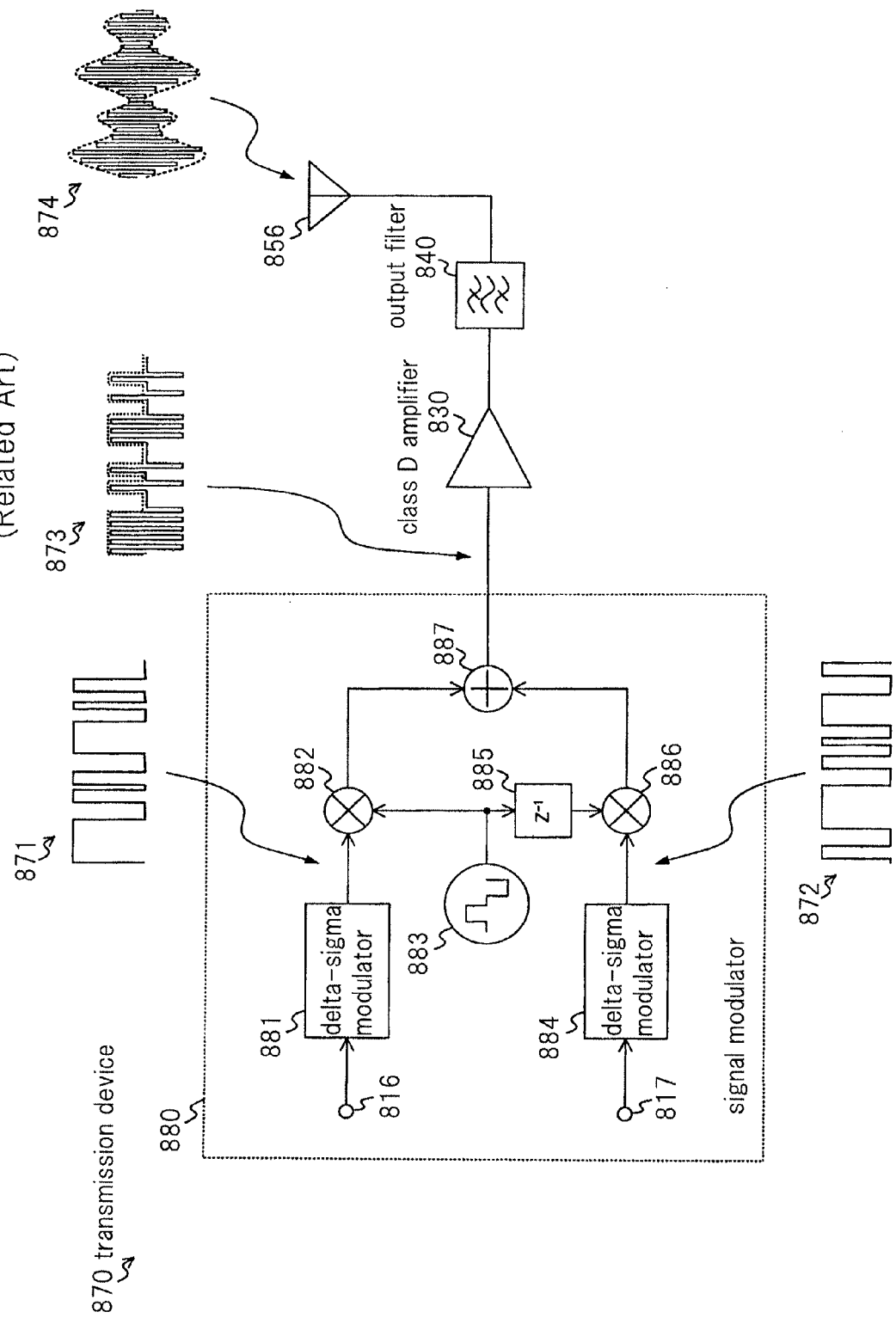
FIG. 5 is a block diagram illustrating an exemplary configuration of transmission device 870.

Accordingly, power amplifier 700 achieves improved power efficiency even in a region where the amplitude component of an input signal is small, as compared with transmission devices 850 and 870 illustrated in FIGS. 4 and 5 in which a modulated signal is amplified by one class D amplifier.

The reason is as follows. In transmission devices 850 and 870, one class D amplifier 830 is used to amplify modulated signals in a region where the amplitude component of an input signal is large as well as a region where the amplitude component of the input signal is small in transmission devices 850 and 870, therefore the influence of a fixed power loss increases relatively and the efficiency significantly decreases as the amplitude component decreases. In transmission device 120 of the third exemplary embodiment, only one amplifier 731 from among the amplifiers, operates in a region where the amplitude component of an input signal is small, therefore a fixed power loss can be reduced.

Furthermore, power amplifier 700 can achieve improved average power efficiency weighted on the basis of probability density characteristic 809, as compared with a power amplifier in which one class D amplifier is used to amplify a modulated signal.

While the third exemplary embodiment has been described in conjunction with a modulated signal that has two discrete amplitude levels, three or more discrete amplitude levels may be set for the modulated signal as appropriate for a system to which this exemplary embodiment is applied. In that case, an amplifier or amplifiers and a switch or switches are added to power amplifier 700 according to the number of the discrete amplitude levels.

A transmission device according to a fourth exemplary embodiment will be described next with reference to drawings.

Figure 18:
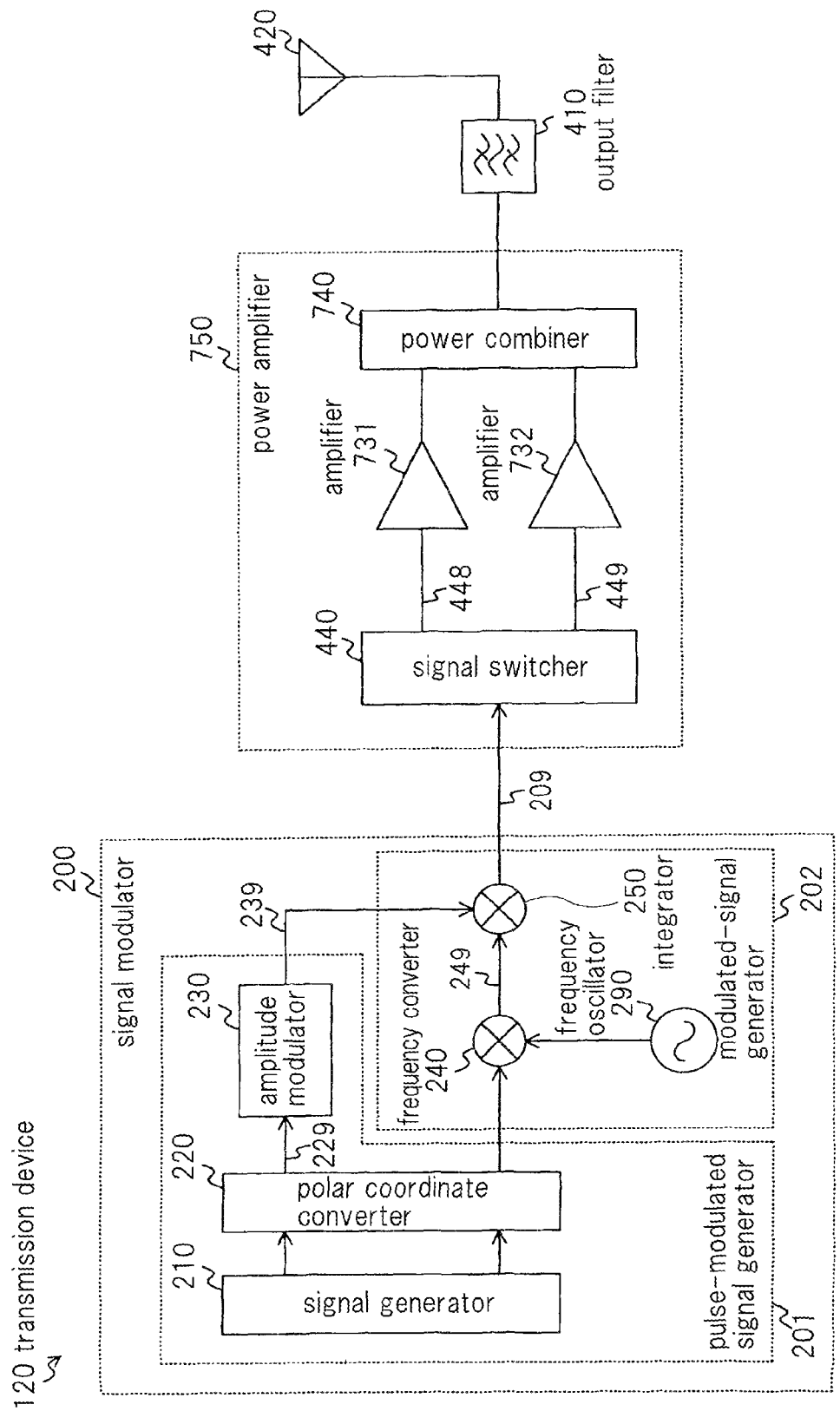
FIG. 18 is a block diagram illustrating an exemplary configuration of transmission device 130 according to a fourth exemplary embodiment.

FIG. 18 is a block diagram illustrating an exemplary configuration of transmission device 130 according to the fourth exemplary embodiment. Transmission device 130 includes power amplifier 750 that includes signal switcher 440 in place of power amplifier 300 in transmission device 100 illustrated in FIG. 6. Output filter 410 and antenna 420 are similar to those illustrated in FIG. 6 and therefore are given the same reference numerals and thus description of these components will be omitted here.

Signal modulator 200 multiplies a phase modulated signal by a pulse modulated signal whose amplitude component is subjected to delta-sigma modulation with one of two saturation levels that corresponds to the amplitude component of the input signal as described with reference to FIG. 6. The modulated signal is a signal that has an amplitude level that discretely changes according to the pulse height of the pulse-modulated signal that has two pulse height values, "0.5" and "1.0".

Signal modulator 200 has a configuration similar to that illustrated in FIG. 6, therefore the same reference numerals as those in FIG. 6 are given to the components of signal modulator 200 and thus description of these components will be omitted here.

Power amplifier 750 is power amplifying means that amplifies a modulated signal generated by signal modulator 200. Power amplifier 750 includes signal switcher 440, amplifiers 731 and 732, and power combiner 740. Power amplifier 740 is similar to the one illustrated in FIG. 17 and therefore is given the same reference numeral and thus description of power amplifier 740 will be omitted here.

Amplifiers 731 and 732 are amplifying means or operating amplifying means similar to those illustrated in FIG. 17. Amplifier 731 amplifies a modulated signal when the pulse height of the pulse-modulated signal is greater than or equal to "0.5". Amplifier 731 is an amplifier for a modulated signal when the pulse height of the pulse-modulated signal is greater than or equal to "0.5".

Amplifier 732 amplifies a modulated signal when the pulse height of the pulse-modulated signal is "1.0". Amplifier 732 is an amplifier for a modulated signal when the pulse height of the pulse-modulated signal is greater than or equal to "1.0".

Signal switcher 440 is feeding means that produces signals to be provided to amplifiers 731 and 732 on the basis of the amplitude level of a modulated signal from signal line 209. Signal switcher 440 provides the modulated signal from signal line 209 to amplifier 731 through signal line 448.

Signal switcher 440 extracts a modulated signal when the pulse height of the pulse-modulated signal is "1.0" through signal line 449 and provides the extracted modulated signal to amplifier 732.

According to the fourth exemplary embodiment, signal switcher 440 detects the amplitude level of a modulated signal from signal line 209. When a modulated signal is provided while the pulse height of the pulse-modulated signal is "0.0" or "0.5", signal switcher 440 provides a modulated signal while the pulse height of the pulse-modulated signal is "0.0" to amplifier 732.

On the other hand, when a modulated signal is provided while the pulse height of the pulse-modulated signal is "1.0", signal switcher 440 provides the modulated signal when the pulse height of the pulse-modulated signal is "1.0" to amplifier 732.

Signal switcher 440 provides a modulated signal while the pulse height of the pulse-modulated signal is greater than or equal "0.5" to amplifier 731 and provides a modulated signal when the pulse height of the pulse-modulated signal is greater than or equal to "1.0" to amplifier 732. Examples of modulated signals provided from signal switcher 440 onto signal lines 448 and 449 are shown in FIG. 19.

Figure 19A:
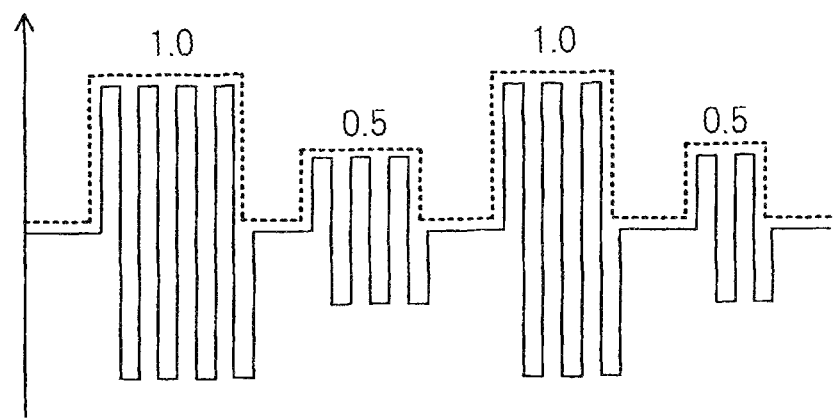
FIG. 19a is a diagram illustrating an example of a modulated signal provided to amplifier 731.
Figure 19B:
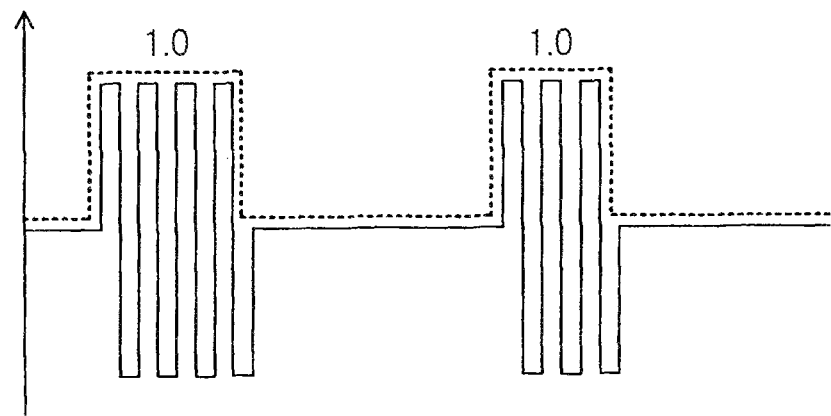
FIG. 19b is a diagram illustrating an example of modulated signal provided to amplifier 732.

FIG. 19a is a diagram illustrating an example of a modulated signal provided from signal switcher 440 into signal line 448. FIG. 19b is a diagram illustrating an example of a modulated signal provided from signal switcher 440 into signal line 449. In FIGS. 19a and 19b, the horizontal line represents time and the vertical line represents the magnitude of amplitude.

According to the fourth exemplary embodiment, signal switcher 440 provides amplifiers 731 and 732 that are in a one-to-one correspondence with discrete amplitude levels of a modulated signal with modulated signals that have amplitude levels corresponding to amplifiers 731 and 732 or greater. Accordingly, only one amplifier 731 from among the amplifiers in transmission device 130 operates in a region where the amplitude component of an input signal is small, as in the third exemplary embodiment. Therefore, a fixed power loss is smaller and a higher power efficiency can be achieved as compared with a transmission device in which one class D amplifier is used to amplify a modulated signal.

According to the fourth exemplary embodiment, the circuit size of power amplifier 750 can be reduced as compared with the third embodiment because switches 721 and 722 do not need to be provided. This means that high power efficiency can be maintained even if a large back-off is provided.

As described above, a transmission device according to any of the exemplary embodiments of the present invention can change the number of operating amplifiers according to the amplitude of the input signal. When the amplitude of the input signal is small, the transmission device can cause only one amplifier to operate and can increase the number of operating amplifiers as the amplitude of the input signal increases. In this way, the saturated output power of the entire power amplifier (or the size of the entire power amplifier) can be optimally changed according to the amplitude of the input signal.

Furthermore, in the transmission device according to any of the exemplary embodiments of the present invention, amplitude information of an input signal input into an amplifier is represented by the duty ratio between on and off periods of the input signal. Therefore, if each individual amplifier is a class D amplifier, the class D amplifier amplifies a modulated signal with an efficiency of, ideally, 100% in the on-period of the input signal and does not consume power in the off period. Accordingly, the transmission device as a whole always operates with an efficiency of, ideally, 100%.

Furthermore, the transmission device according to any of the exemplary embodiment optimally changes the number of operating amplifiers according to the amplitude of the input signal. Therefore, if a finite loss occurs in a class D amplifier, the influence of the switching loss is relatively small even in a region where the magnitude of the input signal is small.

While the exemplary embodiments have been described with examples in which signal modulators 200 and 600 generate modulated signals that have two or three discrete amplitude levels on the basis of the amplitude component of an input signal, signal modulators 200 and 600 may generate a modulated signal having four or more discrete amplitude levels. In that case, waveform distortion of an output signal to be output from antenna 420 can be further reduced.

While the exemplary embodiments have been described with examples in which the power amplifier includes as many amplifiers as the number of discrete amplitude levels of a modulated signal, the power amplifier may include more amplifiers than the number of discrete amplitude levels of the modulated signal. In that case, again, power loss caused by switching of the amplifiers in the power amplifier can be reduced by decreasing the number of operating amplifiers as the magnitude of the input signal decreases. Thus, the transmission device can reduce any decrease in the power efficiency of the power amplifier.

Configurations illustrated in the exemplary embodiments described above are illustrative only. The present invention is not limited to the configurations.

This application is based upon and claims the benefit of priority from Japanese Patent Application No. 2009-278399 filed on Dec. 8, 2009, the content of which is incorporated by reference.

REFERENCE SIGNS LIST 100, 110, 120, 130 . . . Transmission device
200, 600 . . . Signal modulator
201, 601 . . . Pulse-modulated signal generator
202, 690 . . . Modulated signal generator
210, 610 . . . Signal generator
220 . . . Polar coordinate converter
230 . . . Amplitude modulator
231 . . . Gain setter
232, 233 . . . Gain multiplier
240 . . . Frequency converter
250 . . . Integrator
260 . . . Delta-sigma modulator
261, 263 . . . Adder
262, 264 . . . Integrator
265 . . . Quantizer
266 . . . Digital-analog converter
267, 268 . . . Multiplier
300, 500, 700, 750 . . . Power amplifier
310, 510, 710 . . . Power divider
320, 350, 520, 550, 570, 731, 732 . . . Amplifier
330, 340, 530, 540, 580 . . . ¼-wavelength transmission line
360, 590, 591 . . . Combiner
410 . . . Output filter
420 . . . Antenna
430, 440 . . . Signal switcher 560 ... ½-wavelength transmission line
602 ... Integrated signal generator
620 ... Amplitude calculator
630 ... In-phase-component modulator
640, 670 ... Integrator
650 ... Clock signal generator
660 ... Quadrature-component modulator
680 ... Delayer
720 ... Feeder
721, 722 ... Switch
740 ... Power combiner

What is claimed is:

1. A transmission device for amplifying and transmitting an input signal including an amplitude component and a phase component, the transmission device comprising:
a pulse-modulated signal generator that generates a pulse-modulated signal by changing a width of a pulse or density of a pulse according to magnitude of the amplitude component of the input signal while discretely changing a height of the pulse according to the magnitude of the amplitude component of the input signal;
a modulated signal generator that integrates the pulse-modulated signal and the phase component of the input signal to generate a modulated signal having an amplitude level that discretely changes according to a height of a pulse of the pulse-modulated signal;
a power amplifier that includes at least as many amplifiers as the number of discrete amplitude levels of the modulated signal, combines outputs of operating amplifier and outputs a combined output, wherein the number of the operating amplifier that amplify the modulated signal from among the increases as an amplitude level of the modulated signal increases; and
a filter that eliminates a square-wave component from the output of the power amplifier.

2. The transmission device according to claim 1, wherein any one of the amplifiers is a main amplifier;
wherein an amplifier from among the amplifiers other than the main amplifier is a peak amplifier; and
the power amplifier is a Doherty-type amplifier in which the main amplifier and the peak amplifier are connected in parallel with each other through a transmission line.

3. The transmission device according to claim 1, wherein each of the amplifier amplifies the modulated signal when accepting the modulated signal; and
the power amplifier includes a controller that controls, for each of the amplifiers, whether or not the modulated signal is to be provided to the amplifier, on the basis of the amplitude level of the modulated signal.

4. The transmission device according to claim 1, wherein:
each of the amplifiers is in one-to-one correspondence with the discrete amplitude levels and, when accepting the modulated signal, amplifies the modulated signal; and
the power amplifier includes a feeder for feeding one signal from among the modulated signals that has an amplitude level higher than or equal to a level corresponding to the amplifier as the modulated signal.

5. The transmission device according to claim 1, wherein each of the amplifiers is a switching mode amplifier.

6. The transmission device according to claim 1, wherein the pulse-modulated signal generator comprises:
a first variable-gain amplifier that has a gain that discretely increases as the amplitude component of the input signal decreases, and amplifies the amplitude component of the input signal with the gain;
a modulator that generates a 1-bit signal by delta-sigma modulation or pulse-width modulation of an output of the first variable-gain amplifier; and
a second variable-gain amplifier that generates the pulse modulated-signal by amplifying the 1-bit signal with a gain that is equivalent to the reciprocal of the gain.

7. A transmission device for amplifying and transmitting an input signal that includes an I component and a Q component that are orthogonal to each other and has an amplitude component defined by the I component and the Q component, the transmission device comprising:
a pulse-modulated signal generator that generates a pulse-modulated signal of the I component by changing a width of a pulse or density of a pulse according to magnitude of the I component while discretely changing a height of the pulse according to magnitude of the amplitude component of the input signal, and generates a pulse-modulated signal of the Q component by changing a width of a pulse or density of a pulse according to magnitude of the Q component while discretely changing a height of the pulse according to the magnitude of the amplitude component of the input signal;
a clock signal generator that generates a clock signal having an amplitude level that repeatedly assumes a, 0, −a, and 0, in this order, where a is a positive number;
an integrated signal generator that generates a first integrated signal by integrating the clock signal and the pulse-modulated signal of the I component and generates a second integrated signal by integrating a signal that is the clock signal delayed by 1 clock period and the pulse-modulated signal of the Q component;
a modulated signal generator that generates a modulated signal having an amplitude level that discretely changes according to pulse height of the pulse modulated signals of the I and Q components by adding the first integrated signal and the second integrated signal together;
a power amplifier that receives the modulated signal as an input, includes at least as many amplifiers as the number of the discrete amplitude levels of the modulated signal, combines outputs of operating amplifier, and outputs a combined output, wherein the number of the operating amplifier that amplify the modulated signal from among the amplifier increases as the amplitude level of the modulated signal increases; and
a filter that eliminates a square-wave component from an output of the power amplifier.

8. The transmission device according to claim 7, wherein the pulse-modulated signal generator comprises:
a first variable-gain amplifier that has a gain that discretely increases as the amplitude component of the input signal decreases and amplifies the I component with the gain;
a first modulator that generates a first 1-bit signal by delta-sigma modulation or pulse-width modulation of an output of the first variable-gain amplifier;
a second variable-gain amplifier that generates a pulse-modulated signal of the I component by amplifying the first 1-bit signal with a gain equivalent to the reciprocal of the gain used by the first variable-gain amplifier for amplifying the I component from which the first 1-bit signal has been generated;
a third variable-gain amplifier that has a gain that discretely increases as the amplitude component of the input signal decreases and amplifies the Q component with the gain;
a second modulator that generates a second 1-bit signal by delta-sigma modulation or pulse-width modulation of an output of the third variable-gain amplifier; and a fourth variable-gain amplifier that generates a pulse-modulate signal of the Q component by amplifying the second 1-bit signal with a gain equivalent to the reciprocal of the gain used by the third variable-gain amplifier for amplifying the Q component from which the first 1-bit signal has been generated.

9. The transmission device according to claim 7, wherein any one of the amplifiers is a main amplifier;
wherein an amplifier from among the amplifiers other than the main amplifier is a peak amplifier; and
the power amplifier is a Doherty-type amplifier in which the main amplifier and the peak amplifier are connected in parallel with each other through a transmission line.

10. The transmission device according to claim 7, wherein each of the amplifier amplifies the modulated signal when accepting the modulated signal; and
the power amplifier includes a controller that controls, for each of the amplifiers, whether or not the modulated signal is to be provided to the amplifier, on the basis of the amplitude level of the modulated signal.

11. The transmission device according to claim 7, wherein:
each of the amplifiers is in one-to-one correspondence with the discrete amplitude levels and, when accepting the modulated signal, amplifies the modulated signal; and
the power amplifier includes a feeder for feeding one signal from among the modulated signals that has an amplitude level higher than or equal to a level corresponding to the amplifier as the modulated signal.

12. The transmission device according to claim 7, wherein each of the amplifiers is a switching mode amplifier.

* * * * *